United States Patent [19]
Matsuo et al.

[11] Patent Number: 5,731,634
[45] Date of Patent: Mar. 24, 1998

[54] SEMICONDUCTOR DEVICE HAVING A METAL FILM FORMED IN A GROOVE IN AN INSULATING FILM

[75] Inventors: Mie Matsuo, Yokohama; Haruo Okano, Tokyo; Nobuo Hayasaka, Yokosuka; Kyoichi Suguro, Yokohama; Hideshi Miyajima, Tokyo; Jun-ichi Wada, Yokohama, all of Japan

[73] Assignee: Kabushiki Kaisha Toshiba, Kawasaki, Japan

[21] Appl. No.: 659,389

[22] Filed: Jun. 6, 1996

Related U.S. Application Data

[63] Continuation of Ser. No. 405,948, Mar. 17, 1995, Pat. No. 5,561,082, which is a continuation-in-part of Ser. No. 99,695, Jul. 30, 1993, Pat. No. 5,424,246.

[30] Foreign Application Priority Data

Jul. 31, 1992 [JP] Japan .................... 4-205579
Jul. 26, 1993 [JP] Japan .................... 5-183880

[51] Int. Cl.$^6$ .................... H01L 23/48; H01L 23/52; H01L 29/40
[52] U.S. Cl. .................... 257/752; 257/751; 257/761; 257/762; 257/763

[58] Field of Search .................... 257/751, 752, 257/761, 762, 763

[56] References Cited

U.S. PATENT DOCUMENTS

| | | | |
|---|---|---|---|
| 4,977,440 | 12/1990 | Stevens | 257/751 |
| 5,300,813 | 4/1994 | Joshi et al. | 257/752 |
| 5,569,961 | 10/1996 | Lee | 257/751 |
| 5,585,673 | 12/1996 | Joshi et al. | 257/751 |

Primary Examiner—Mahshid D. Saadat
Assistant Examiner—T. M. Arroyo
Attorney, Agent, or Firm—Oblon, Spivak, McClelland, Maier & Neustadt, P.C.

[57] ABSTRACT

The present invention provides a method of manufacturing a semiconductor device, including the steps of forming a metal oxide film made of a metal oxide having a decrease in standard free energy smaller than a decrease in standard free energy of hydrogen oxide or of carbon oxide, on an insulating film formed on a semiconductor substrate, forming a metal oxide film pattern by subjecting a treatment to the metal oxide film, and converting said metal oxide pattern into at least one of an electrode and a wiring made of a metal which is a main component constituting the metal oxide, by reducing the metal oxide film pattern at a temperature of 80° to 500° C.

14 Claims, 26 Drawing Sheets

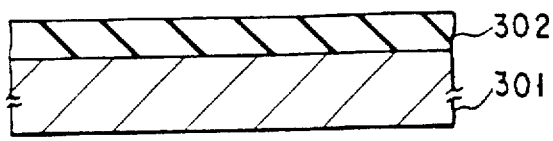
FIG. IA (PRIOR ART)
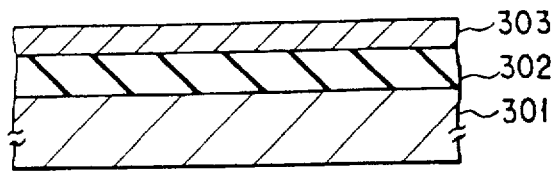
FIG. IB (PRIOR ART)
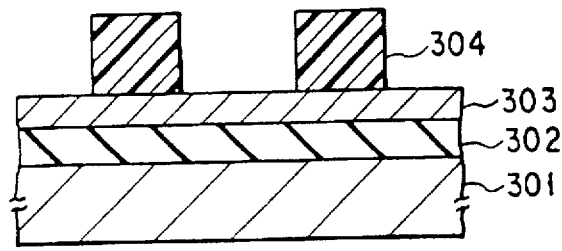
FIG. IC (PRIOR ART)
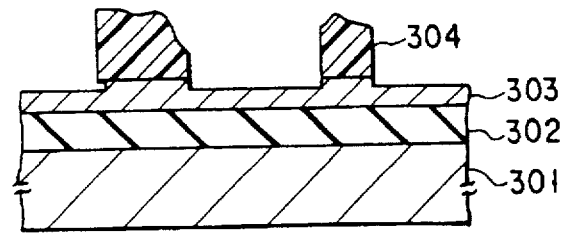
FIG. ID (PRIOR ART)
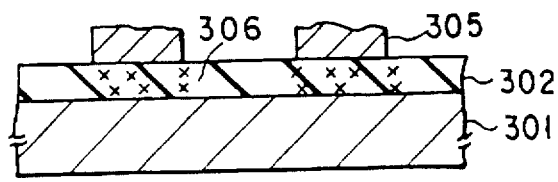
FIG. IE (PRIOR ART)
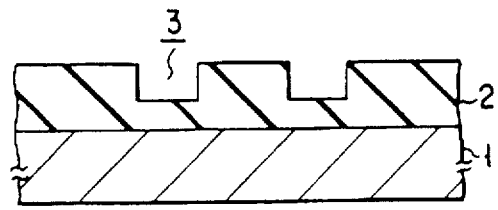
FIG. 2A
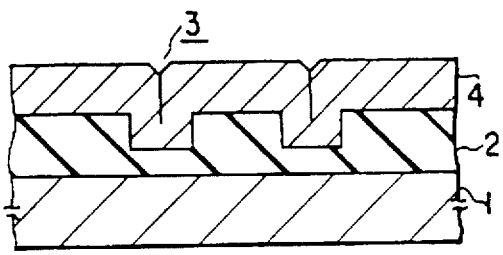
FIG. 2B
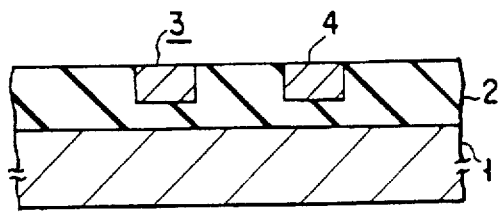
FIG. 2C
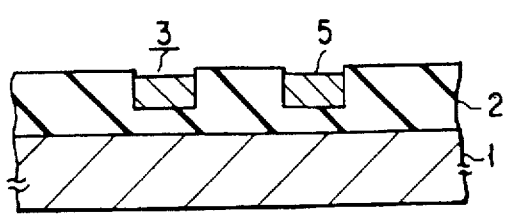
FIG. 2D

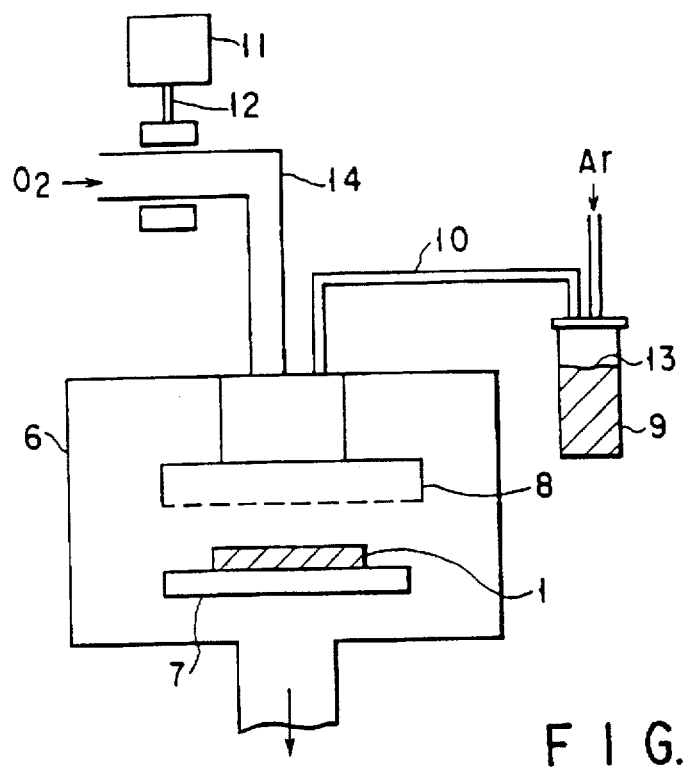
F I G. 3
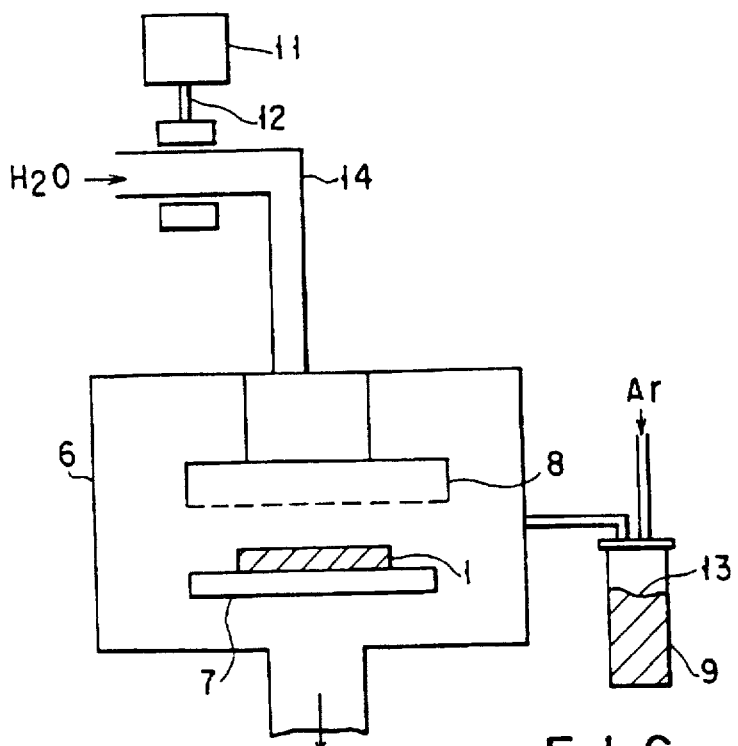
F I G. 4

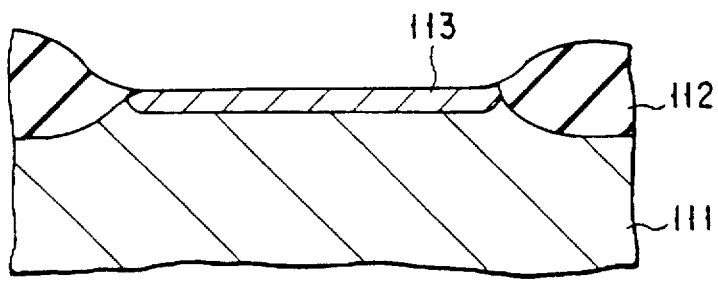
F I G. 19A
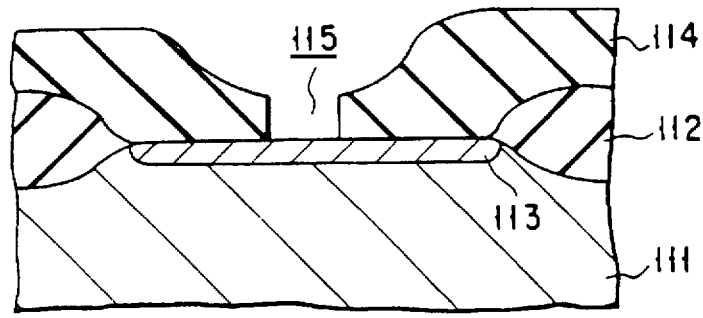
F I G. 19B
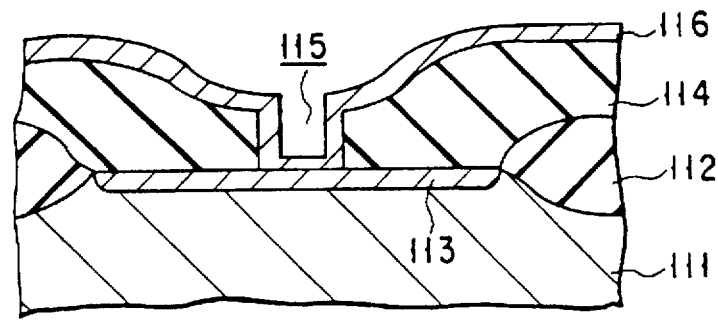
F I G. 19C
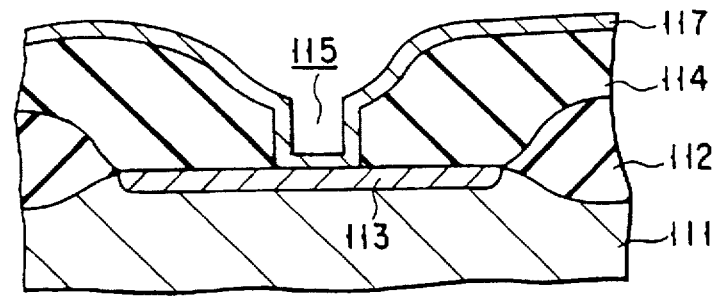
F I G. 19D
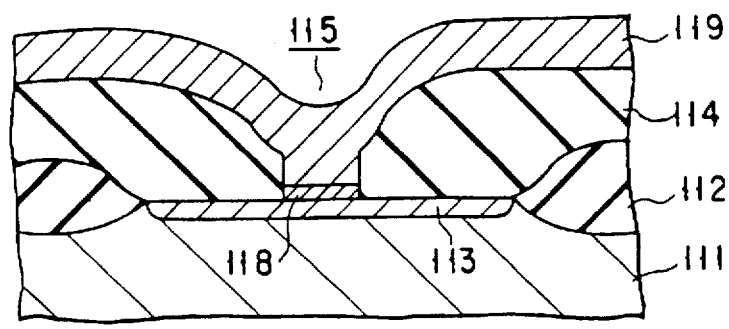
F I G. 19E

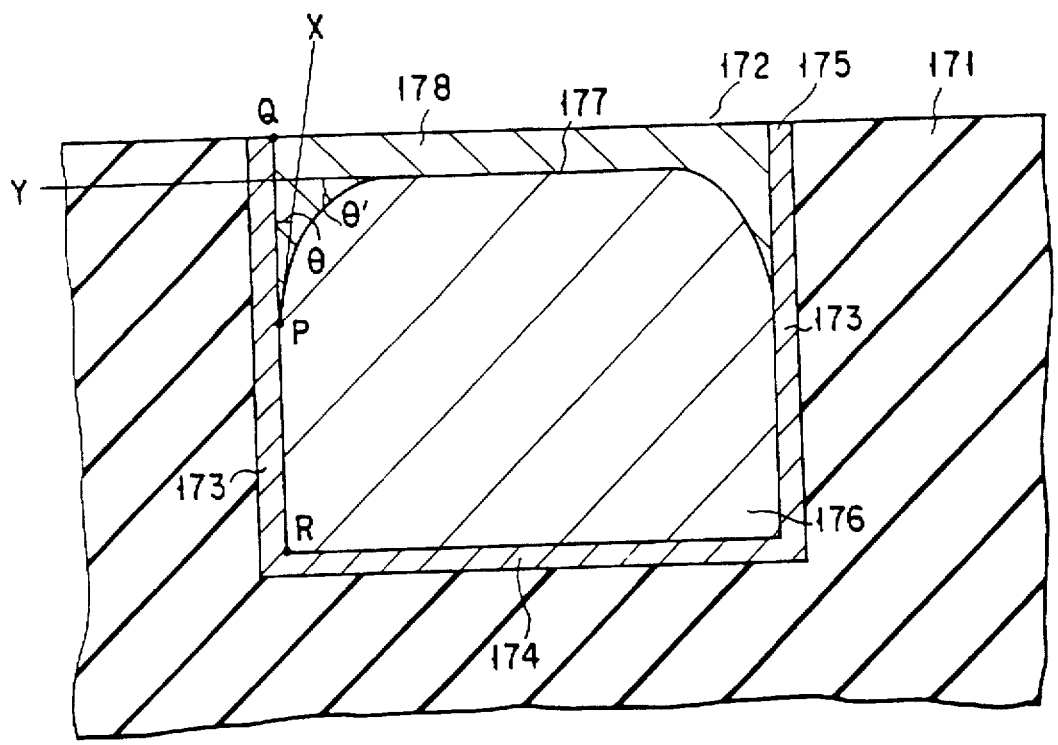
F I G. 25
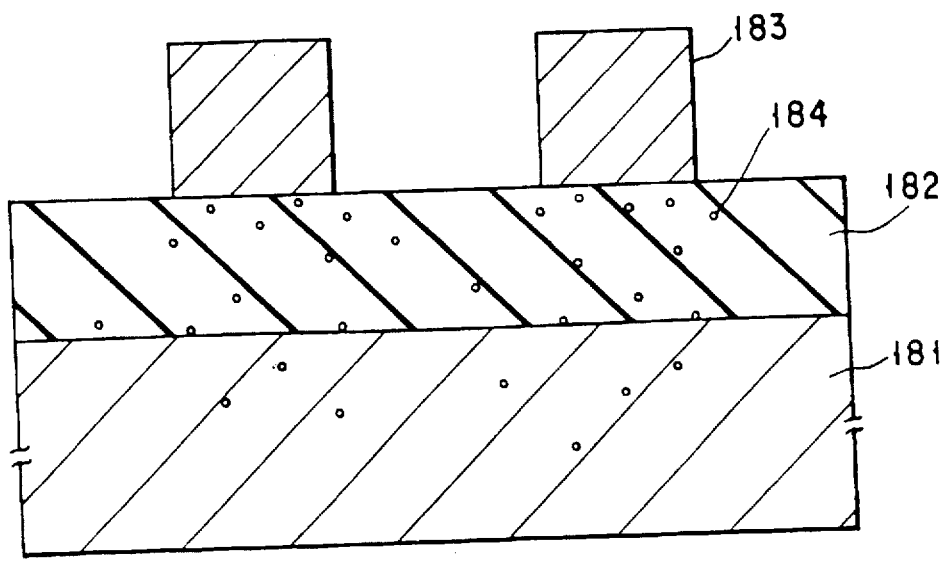
F I G. 26

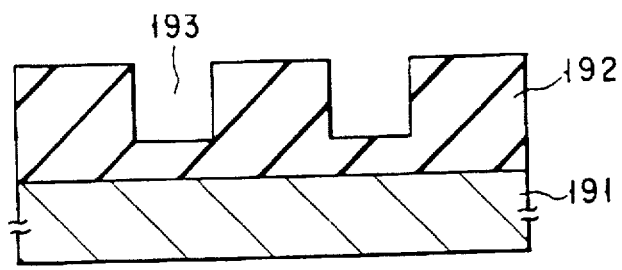
F I G. 28A
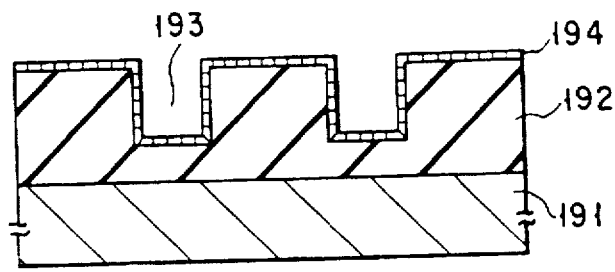
F I G. 28B
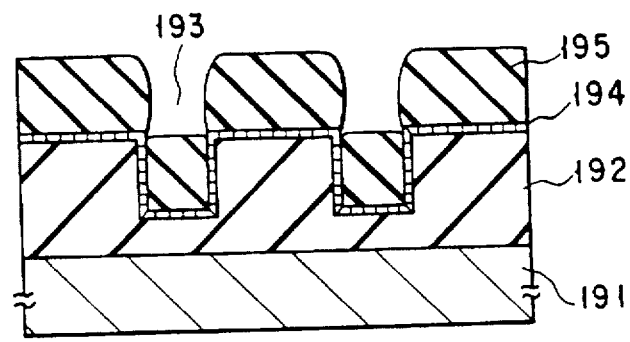
F I G. 28C
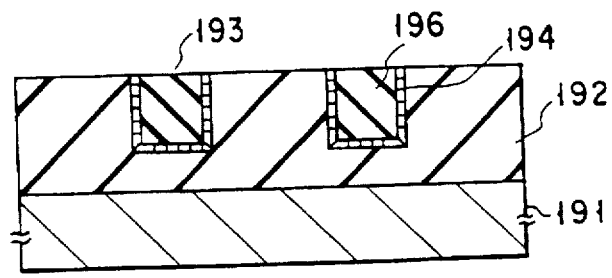
F I G. 28D
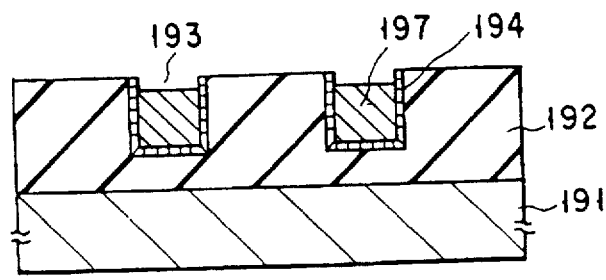
F I G. 28E

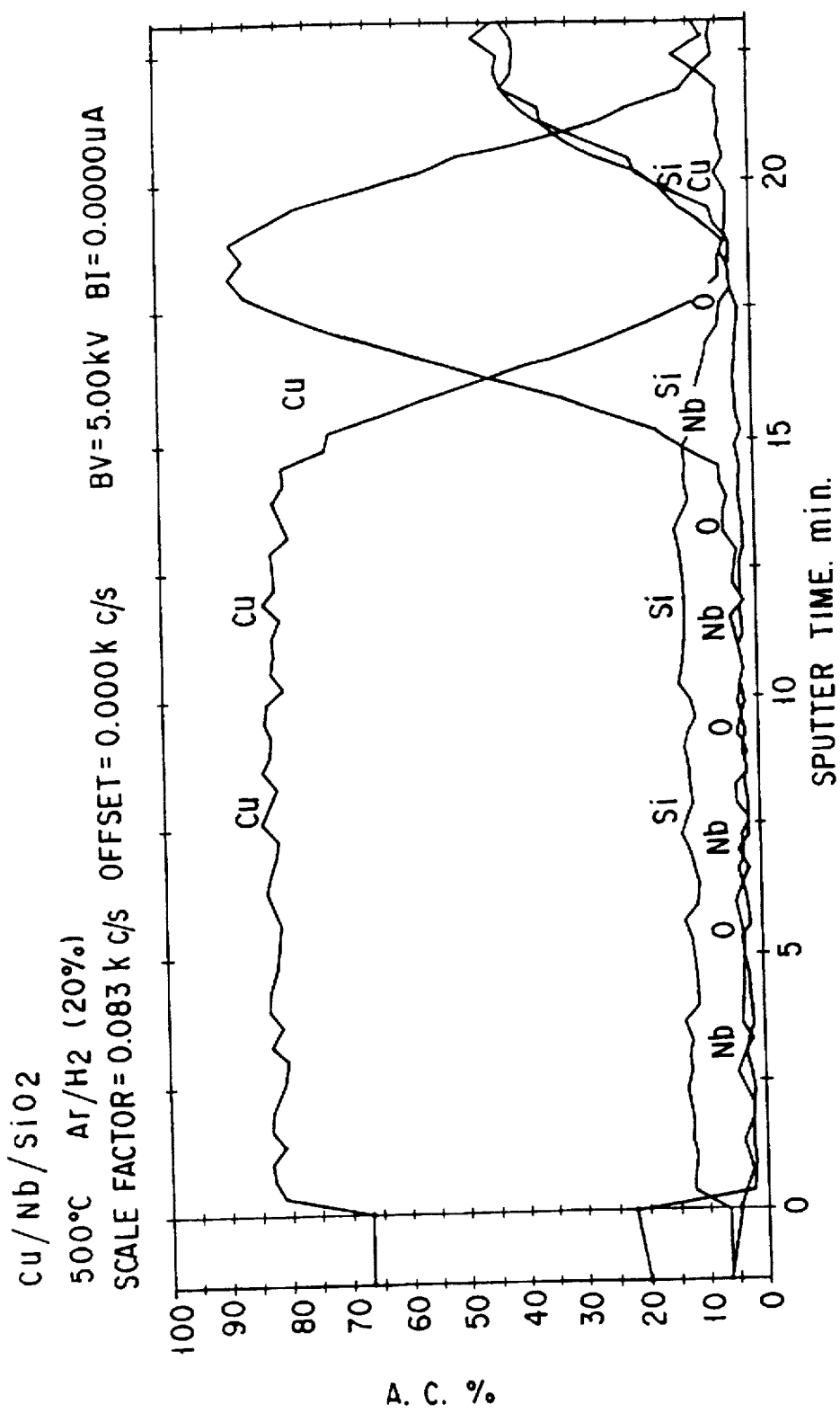
F I G. 30

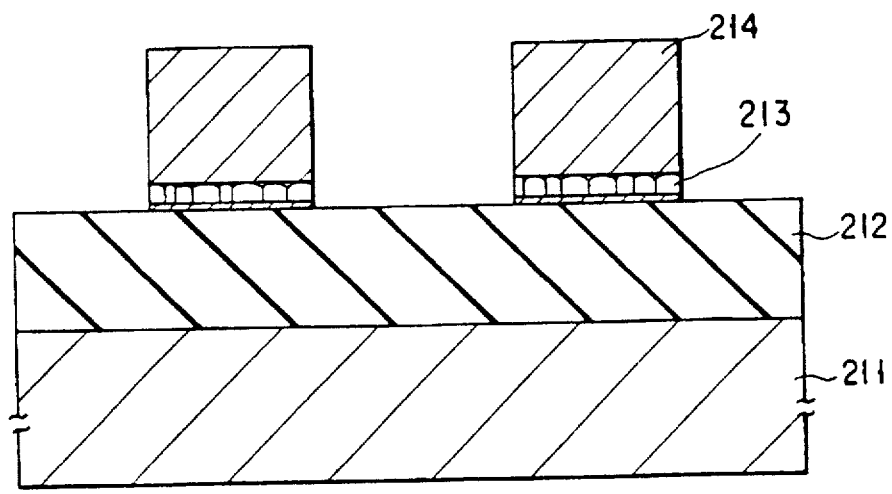
F I G. 32
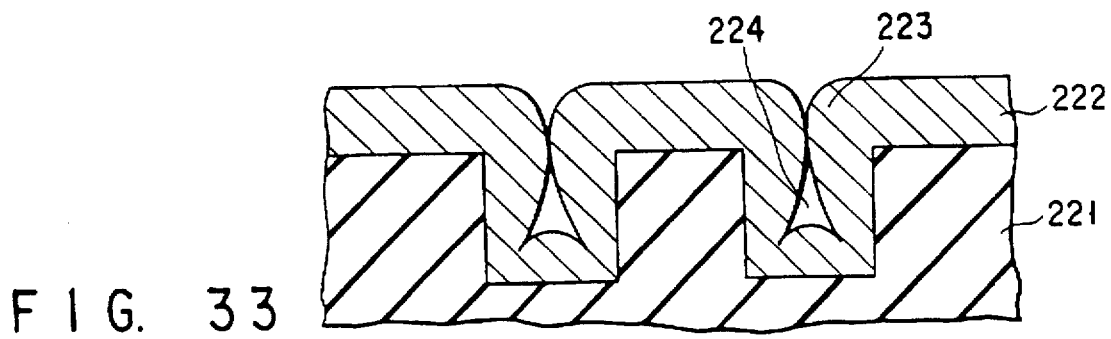
F I G. 33
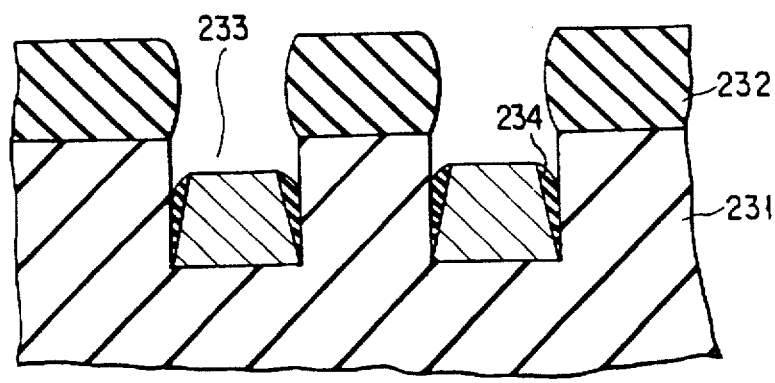
F I G. 34

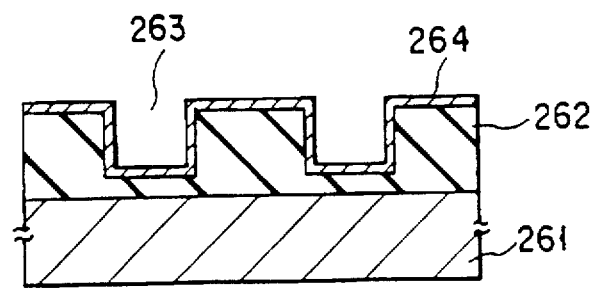
F I G. 37A
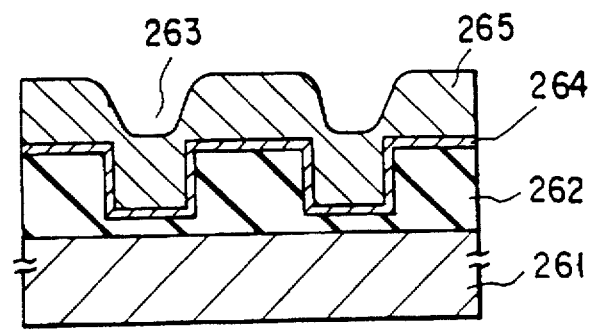
F I G. 37B
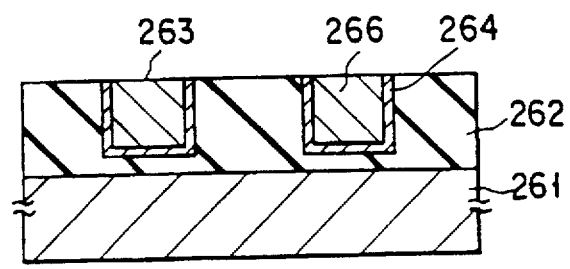
F I G. 37C
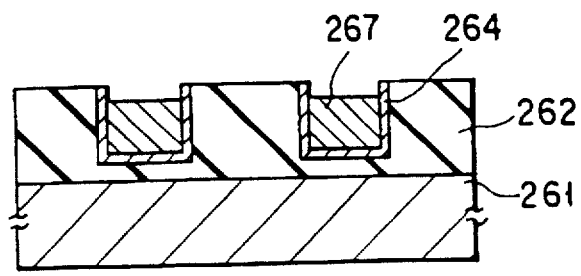
F I G. 37D

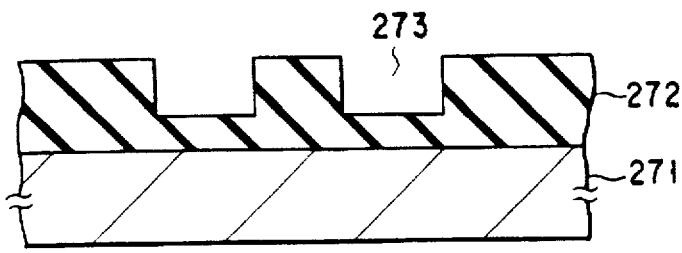
F I G. 38A
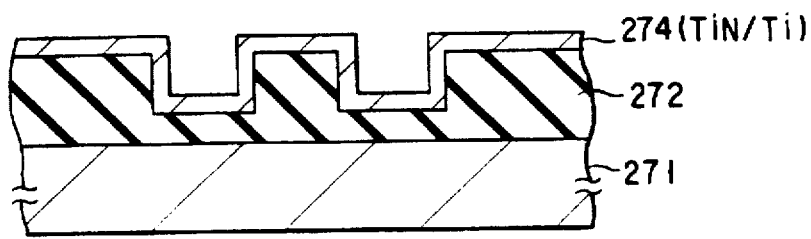
F I G. 38B
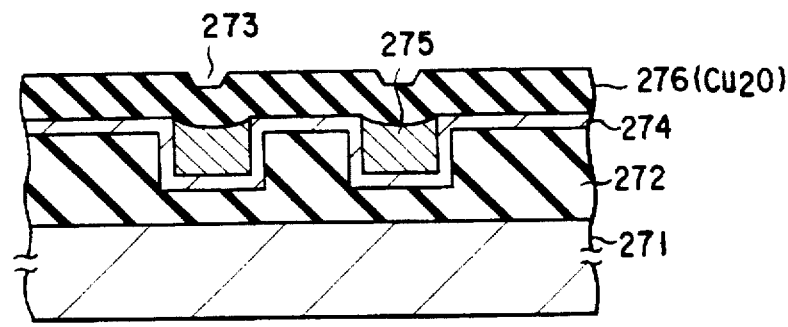
F I G. 38C
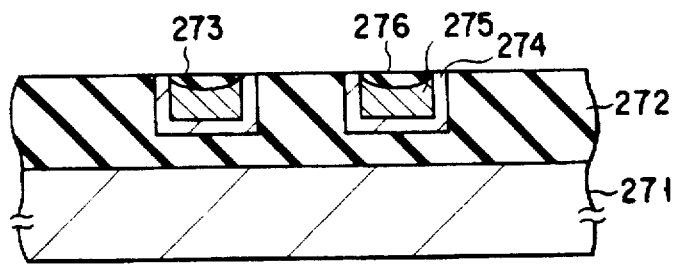
F I G. 38D
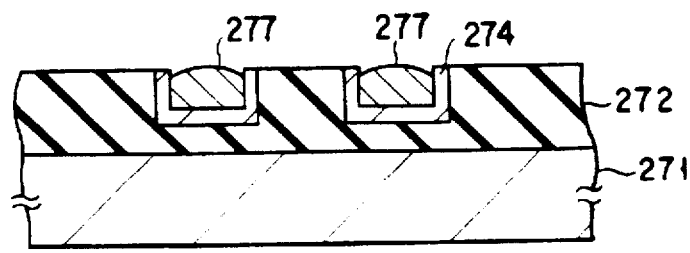
F I G. 38E

SEMICONDUCTOR DEVICE HAVING A METAL FILM FORMED IN A GROOVE IN AN INSULATING FILM

CROSS-REFERENCES TO THE RELATED APPLICATIONS

This is a Continuation, of application Ser. No. 08/405,948 filed on Mar. 17, 1995, now patented (U.S. Pat. No. 5,561,082) which is a Continuation-in-Part of application Ser. No. 08/099,695 filed on Jul. 30, 1993, now patented (U.S. Pat. No. 5,424,246).

BACKGROUND OF THE INVENTION

1. Field of the Invention

The present invention relates to a semiconductor device and a method of manufacturing the same and, more particularly, to an improvement of a method of forming an electrode or a wiring layer.

2. Description of the Related Art

In recent years, as the integration density of a semiconductor device has been increased, the thickness and width of a wiring layer have been decreased, and a multi-layered wiring structure has been developed. An Al alloy containing aluminum (Al) as a main component has been conventionally used as a wiring material due to its low wiring resistance and its high workability.

However, even when the sectional area of a wiring layer is decreased, a signal current amount required for the wiring layer is not reduced. For this reason, a current density is increased, and disconnection of the wiring layer disadvantageously occurs due to electromigration (to be referred to as EM hereinafter). In addition, as a multi-layered wiring is developed, the wiring layer receives complex heat hysteresis. For this reason, disconnection of the wiring layer disadvantageously occurs due to stress migration (to be referred to as SM hereinafter) caused by a thermal stress acting on the wiring layer. In a device, although the high-speed operation and low power consumption of a switching element are strongly demanded, Al cannot easily satisfy the demand because of its material properties.

Noble metals, such as copper (Cu) and silver (Ag), having a resistivity lower than that of Al and a melting point higher than that of Al, have received a great deal of attention and have been examined as next-generation materials.

The electric resistivities, melting points, and self-diffusion coefficients of Al, tungsten (W), Cu, and Ag are shown in Table 1. In this case, the diffusion coefficient D (cm²/sec) of a metal is expressed by the following equation:

$$D = D_0 \exp(-Q/k_B T)$$

where $k_B$ represents Boltzman constant, the unit of $D_0$ is cm²/sec, the unit of Q is eV, and the unit of T is K. In Table 1, $D_0$ and Q are represented.

TABLE 1

| Element | Electric Resistivity µΩ·cm | Melting Point °C. | Self-diffusion Coefficient | |
|---|---|---|---|---|
| | | | D0(cm2/sec) | Q(ev) |
| Al | 2.61 | 660 | 1.71 | 1.48 |
| W | 5.30 | 3382 | 1.90 | 6.07 |
| Cu | 1.72 | 1083 | 0.20 | 2.04 |
| Ag | 1.47 | 960 | 0.46 | 1.91 |

According to Table 1, the melting point and self-diffusion coefficient of the noble metal, such as Cu or Ag, are more than those of Al, but the resistivity of the noble metal is lower than that of Al. In general, it is known that a wiring material having a high melting point and a large self-diffusion coefficient has excellent EM and SM resistances.

The EM resistance is improved for the following reason. The switching speed for the device is determined by the product of the wiring resistance: R and the capacitor: C. That is, since the self-diffusion coefficient of the noble metal, such as Cu or Ag, is sufficiently smaller than that of Al, atomic diffusion in crystal grains and a crystal grain boundary, and on the surfaces of a wiring layer as paths is reduced.

In this manner, the noble metal, such as Cu or Ag, is more excellent than Al in reliability and electric resistivity, and an RC delay caused by a long wiring layer can be relaxed by applying a noble metal wiring layer to a device. For this reason, decrease in switching speed can be suppressed. In addition, power consumption in a wiring portion can be decreased and the reliability of the wiring layer can be improved.

When Cu is used as a wiring material, a metal wiring layer is conventionally formed by the following method. That is, as shown in FIG. 1A, an oxide film 202 is formed on a semiconductor substrate 201 consisting of, e.g., silicon. As shown in FIG. 1B, a Cu film 203 is formed on the oxide film 202 by sputtering. As shown in FIG. 1C, a resist pattern 204 is formed on the Cu film 203 by using a photoresist technique. Finally, the Cu film 203 is patterned by RIE (Reactive Ion Etching) using the resist pattern 204 as a mask so as to form a Cu wiring layer.

However, the method of this type has the following problems.

When a Cu wiring layer is to be formed, since there is no halide having a high vapor pressure at about an atmospheric temperature, RIE must be performed at a high temperature of 300° C. or more. The resist pattern 204 is degraded during etching of the Cu film 203 because the heat resistance of the resist generally is about 200° C. For this reason, as shown in FIG. 1D, a pattern width is decreased or the surface of the wiring layer is deformed, so a Cu wiring layer having a predetermined shape cannot be formed.

A Cu film has no acid-resistance because a passivation film is not formed on Cu unlike on Al film. For this reason, when ashing of the resist pattern 204 is performed by oxygen to remove the resist pattern 204, as shown in FIG. 1E, the surface and inside of a Cu wiring layer 205 are oxidized, and the electric resistivity of the Cu wiring layer 205 is increased. In addition, Cu atoms 206 in the Cu wiring layer 205 are diffused in a deep portion of the oxide film 202 because Cu is diffused in an oxide film at high speed, so that an operation error occurs in the element. The adhesion properties between the wiring layer and an insulating interlayer or a passivation film are disadvantageously degraded.

As a method of solving the problems caused by ashing, a method of forming a so-called buried wiring layer is proposed. According to this method, a groove serving as a wiring layer is formed in the substrate surface, and a wiring material is selectively grown in the groove by CVD.

However, when an organic source is used as a source gas for selective CVD, impurities such as carbon atoms, hydrogen atoms, and oxygen atoms are mixed in the buried wiring layer, and a low resistivity which is the original characteristic of the material cannot be obtained.

SUMMARY OF THE INVENTION

The present invention has been made in consideration of the above circumstances and has as its object to provide a method of manufacturing a semiconductor device having the step of forming an electrode or a wiring layer having excellent EM and SM resistances without causing an increase in electric resistivity caused by an impurity or the like.

According to the present invention, there is provided a method of manufacturing a semiconductor device, comprising the steps of forming a metal oxide film, essentially consisting of a metal oxide having a decrease in standard free energy smaller than a decrease in standard free energy of hydrogen oxide or of a carbon oxide, on an insulating film formed on a semiconductor substrate, and reducing the metal oxide film to form an electrode-wiring layer essentially consisting of a metal which is a main component constituting the metal oxide.

The reduction may be carried out through a heat treatment in a reducing gas atmosphere containing hydrogen and carbon. Alternatively, the reduction may be carried out through a contact the metal oxide film with a film made of at least one metal selected the group consisting of chromium vanadium, niobium, nickel, titanium and tantalum. The reduction of the metal oxide film may be carried out after patterning the metal oxide film in the form of an electrode or a wiring.

The present invention provides a method of manufacturing a semiconductor device, comprising the steps of forming an insulating film having a surface having a groove portion on a semiconductor substrate;

forming a metal oxide film, essentially consisting of a metal oxide having a decrease in standard free energy smaller than a decrease in standard free energy of a hydrogen oxide or of a carbon oxide, on an entire surface of the insulating film, including the groove portion;

removing the metal oxide film formed on a portion except the groove portion; and reducing the metal oxide film to form an electrode-wiring layer essentially consisting of a metal which is a main component constituting the metal oxide.

It is preferable that the removal of the metal oxide film is performed by a polishing or lift-off method.

The present invention provides a semiconductor device comprising a semiconductor substrate;

an insulating film formed on the semiconductor device and having a surface on which a groove is formed;

a first barrier layer formed on an inner surface of the groove;

an electrode-wiring layer, made of a metal, embedded in the groove having an upper surface shaped into a convex curvature, the upper surface having a tangent point on a surface of the first barrier layer in side walls of the groove; and a second barrier layer covering the electrode wiring layer.

The present invention provides a semiconductor device comprising:

a semiconductor substrate;

an insulating film formed on the semiconductor device;

a barrier layer formed on the insulating film; and an electrode wiring layer formed on the barrier layer;

wherein oxygen is present along an interface between the electrode wiring layer and the barrier layer.

It is preferable that a material of the barrier layer is polycrystalline, and oxygen is present along grain boundaries.

In this embodiment, before the metal film serving as the electrode or wiring layer is formed, the metal oxide film containing a metal serving as the electrode or wiring layer is formed. That is, in place of the metal film in which an impurity such as carbon or hydrogen causing an increase in electric resistivity is bonded to the metal serving as the electrode or wiring layer, the metal oxide film in which oxygen is bonded to a metal is formed.

As film formation conditions of the metal oxide film, a decrease in standard free energy during the formation of the metal oxide film is set to be smaller than that of each of hydrogen and carbon oxides.

In this case, the decrease in standard free energy is a decrease in free energy in an entire system during producing an oxide by a reaction of constitution atoms, i.e., represents stability. For example, a decrease in standard free energy of water ($H_2O$), which is an oxide of hydrogen, is defined as the value obtained by subtracting the entire free energy of the right-hand side system from the entire free energy of the left-hand side system in the reaction formula, $2H+O \rightarrow H_2O$ occurring at particular temperature and pressure. The larger, the value, the more easily the reaction proceeds from the left-hand side of the formula to the right-hand side.

The above film formation conditions are selected because of the following reason. When the metal oxide film is annealed in a reducing gas atmosphere containing hydrogen or carbon, the metal oxide film is preferentially reduced by oxidation of hydrogen or carbon. For this reason, the metal oxide film can be reliably reduced, and a high-purity metal film to be used as an electrode or a wiring layer can be formed.

Therefore, when a noble metal such as Cu is selected as a metal for an electrode or a wiring layer, an electrode or a wiring layer having high EM and SM resistances and a low electric resistivity can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A to 1E are sectional views showing the steps in forming a conventional metal wiring layer;

FIGS. 2A to 2D are sectional views showing the steps informing a metal wiring layer according to the first embodiment of the present invention;

FIG. 3 is a schematic view showing the arrangement of a downflow CVD apparatus used in the first embodiment of the present invention;

FIG. 4 is a schematic view showing the arrangement of another downflow CVD apparatus used in the first embodiment of the present invention;

FIGS. 19A to 19E are sectional views showing the steps in forming a contact electrode according to the ninth embodiment of the present invention;

FIGS. 22, 23, 26, and 27 are sectional views showing metal wiring layers obtained by a conventional method;

FIG. 25 is a sectional view showing a metal wiring layer obtained by the forming steps according to the twelfth embodiment of the present invention;

FIGS. 28A to 28E are sectional views showing the steps in forming a metal wiring layer according to the thirteenth embodiment of the present invention of the present invention;

FIG. 30 is a graph showing an AES element analysis result in the direction of depth of a metal wiring layer obtained by a conventional method;

FIG. 32 is a sectional view showing a metal wiring layer according to the fourteenth embodiment of the present invention;

FIGS. 33 and 34 are views showing the deposition states of metal films obtained by using a normal sputtering apparatus;

FIGS. 37A to 37D are sectional views showing the steps in forming a Cu wiring layer obtained by using the apparatus shown in FIG. 36;

FIGS. 38A to 38E are sectional views showing the steps of forming a metal wiring layer according to Example 5;

DETAILED DESCRIPTION OF THE PREFERRED EMBODIMENTS

Figure 5:
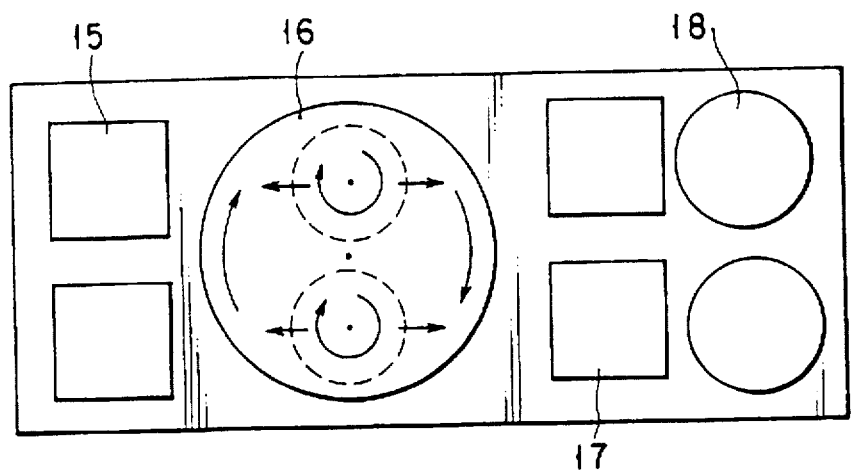
FIG. 5 is a schematic view showing the arrangement of a polishing apparatus used in the first embodiment of the present invention.

Embodiments of the present invention will he described below with reference to the accompanying drawings.

EXAMPLE 1

FIGS. 2A to 2D are sectional views showing the steps in forming a metal wiring layer according to the first embodiment of the present invention.

As shown in FIG. 2A, a BPSG film 2 having a thickness of 1.0 μm is formed on a semiconductor substrate 1 consisting of silicon. A photoresist pattern is formed on the BPSG film 2 by a photoresist method, and the BPSG film 2 is etched by RIE using the photoresist pattern as a mask. Subsequently, ashing of the photoresist pattern is performed to form a groove 3 having a width of 0.4 μm and a depth of 0.3 μm. Note that, when the BPSG film 2 to be etched is formed, one etching stopper layer consisting of SiN or the like may be formed on a portion serving as the bottom surface of the groove 3.

As shown in FIG. 2B, a blanket-like CuO film 4 (metal oxide film) having a thickness of 0.6 μm is formed on the entire surface of the resultant structure. The formation of the CuO film 4 is performed as follows by using a downflow CVD apparatus shown in FIG. 3.

That is, a pressure in a chamber 6 is kept at 20 mTorr, the temperature of the interior of the chamber 6 is set to be 300° C. by a heater 7, and the semiconductor substrate 1 serving as a target substrate and shown in FIG. 2A is placed in the chamber 6.

A microwave from the microwave power supply 11 is radiated on $O_2$ through a waveguide 12 to generate an active gas of oxygen, and the active gas is fed into the chamber 6 through a pipe 14. At the same time, a Cu organic source 13 consisting of Cu(HFA)$_2$ (copper bis (hexafluoroacetylacetonate)) in a vessel 9 kept at 150° C. is fed into the chamber 6 by an Ar gas serving as a carrier gas and having a flow rate of 50 sccm through a pipe 10 kept at 180° C.

The active gas of oxygen, Cu(HFA)$_2$, and the Ar gas are mixed by a shower nozzle 8 having holes arranged at predetermined intervals, and the gas mixture is sprayed onto the semiconductor substrate 1 to form the CuO film 4. The oxygen content of the CuO film 4 was 30%, and the crystal structure of the CuO film 4 was a cubic system.

Even when the organic source 13 is used as a source material, formation of the CuO film 4 from the beginning without forming a Cu film makes it possible to prevent an impurity such as carbon or hydrogen from being bonded to Cu. In this case, CuO is selected as a copper oxide because CuO is stable in copper oxides.

Although the flow rate of Ar and the temperature in the vessel 9 can be properly selected, the temperature in the pipe 10 must be higher than that of the vessel 9 by about 10° C. because so as to solidify the organic source 13. In this embodiment, Cu(HFS)$_2$ is used as the Cu organic source 13. However, Cu(DPM)$_2$ (copper bis(dipivaloylmethanato)) or Cu(ACAC)$_2$ (copper bis(acetylacetonato)) as an acetyleaceto type, CuCl or CuCl$_2$ as a Cu chloride, $\eta^5$-C$_5$H$_5$CuPMe$_3$ ((cyclopentadienyl)copper(trimethylphosphine), $\eta^5$-C$_5$H$_5$CuPEt$_3$ ((cyclopentadienyl)copper(triethylphosphine)), (HFA)Cu(2-Butyne) ((hexafluoroacetylacetonato)copper(2-buthyne)), (HFA)Cu(1,5-COD) ((hexafluoroacetylacetonato)copper(1,5-cyclooctadiene), or the compounds shown in Table 2 may be used as the Cu organic source 13.

TABLE 2

| Acronyms | Chemical Name |
| --- | --- |
| Cu(HFAC)$_2$ | copper bis(hexafluoro acetylacetonate) |
| Cu(PPN)$_2$ | copper bis(pentafluoropropanoylpivaloylmethanato) |
| Cu(nona-F)$_2$ | copper bis(trifluoroethyl amino hexafluoro pentanol) |
| (CuO-t-Bu)$_4$ | copper(tert-butoxide) |
| (t-BuO)CuPMe$_3$ | (tert-butoxy)copper(trimethylphosphine) |
| (ACAC)CuPMe$_3$ | (acetylacetonate)copper(trimethylphosphine) |
| (TFAC)CuPMe$_3$ | (trifluoro acetylacetonate)copper(trimethylphosphine) |
| (HFAC)CuPMe$_3$ | (hexafluoro acetylacetonate)copper(trimethylphosphine) |
| (HFAC)Cu(COD) | (hexafluoro acetylacetonate)copper(1,5 cyclooctadiene) |
| (HFAC)Cu(VTMS) | (hexafluoro acetylacetonate)copper(vinyltrimethysilane) |
| (HFAC)Cu(2-butyne) | (hexafluoro acetylacetonate)copper(2-butyne) |
| (HFAC)Cu(BTMSA) | (hexafluoro acetylacetonate)copper(bis(ti-methylsilyl)acetylene) |
| (HFAC)Cu(2-pentyne) | (hexafluoro acetylacetonate)copper(2-pentyne) |

In this embodiment, although the CuO film is formed by plasma downflow of an O$_2$ gas, the film may be formed using an H$_2$O vapor in place of the O$_2$ gas. When a gas mixture of an H$_2$O vapor and an O$_2$ gas is used, the same effect as described above can be obtained. Note that an oxidizing gas and an organic source may be mixed with each other such that the oxidizing gas and the organic source are independently fed into the chamber 6 as shown in FIG. 4.

As shown in FIG. 2C, the CuO film 4 is removed by polishing except for the CuO film 4 in the groove 3 so as to form the CuO wiring layer 4. The CuO film 4 is polished using a polishing apparatus shown in FIG. 5. That is, when the semiconductor substrate 1 serving as a substrate to be polished is set on a loading portion 15, the semiconductor substrate 1 is conveyed to a polishing portion 16, and the surface of the semiconductor substrate 1 is polished. When the polishing is finished the semiconductor substrate 1 is conveyed to a brush water-washing portion 17, and the semiconductor substrate 1 is washed to remove a polishing liquid and polishing dust attached to the semiconductor substrate 1. Thereafter, the semiconductor substrate 1 is conveyed to an unloading portion 18, thereby completing the polishing step.

Figure 6:
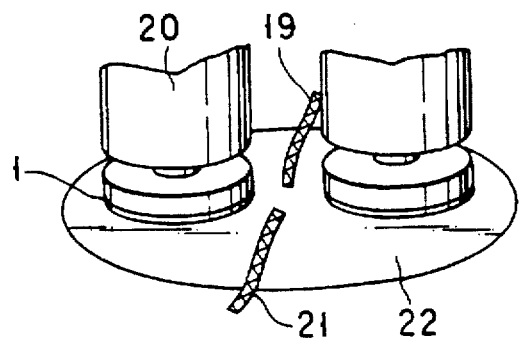
FIG. 6 is a schematic view showing the arrangement of a polishing portion of the polishing apparatus in FIG. 5.

FIG. 6 is a schematic view showing the arrangement of the polishing portion 16. The polishing portion 16 is constituted by a top ring 20 and a turntable 22, and the semiconductor substrate 1 set on the top ring 20 is rotated on the turntable 22. During polishing, a polishing liquid is kept supplied onto the turntable 22 through a polishing liquid supply pipe 21. When the polishing is finished to convey the semiconductor substrate 1 to the unloading portion 18, in the polishing portion 16, distilled water is supplied from a distilled water supply pipe 19 to wash away the used polishing liquid on the turntable 22.

Figure 7:
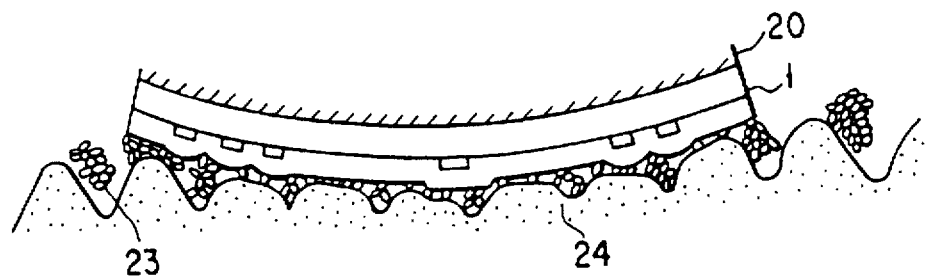
FIG. 7 is a view for explaining a polishing mechanism.

A polishing mechanism is as follows. That is, as shown in FIG. 7, the uneven surface of a water is mechanically polished by polishing particles 23 and a polyurethane cloth 24 having a porous structure, and is chemically etched by a polishing liquid. As a result, smoothing at the atomic level is performed by the above synagetic effect. In this embodiment, an alkaline aqueous solution containing amine as a main component is used as the polishing liquid, and colloidal SiO$_2$ is used as the polishing particles.

Finally, as shown in FIG. 2D, annealing is performed at a pressure of 750 mTorr and a temperature of 500° C. for 30 minutes in a reducing gas atmosphere consisting of 20% of H$_2$ and 80% of Ar so as to reduce the CuO film 4, thereby completing a Cu wiring layer 5 consisting of Cu serving as a metal which is a main component of the CuO film 4. A chemical reaction formula of the above reaction is expressed as follows:

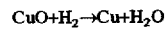

$$CuO + H_2 \rightarrow Cu + H_2O$$

Note that the reaction occurs at 250° C. or more. In this case, since a decrease in standard free energy during formation of CuO is smaller than that during formation of H$_2$O, CuO is preferentially reduced by oxidation of H. Therefore, the CuO film 4 can be reliably reduced, and the Cu wiring layer 5 consisting of high-purity Cu can be obtained. Note that the CuO film 4 is decreased in volume by about 20%.

Note that a pressure, a temperature, and a processing time in the reduction step can be selected depending on the oxygen content and structure of the CuO film 4. For example, when the CuO film 4 having an oxygen content of 50% is formed to have a thickness of 1.5 μm, a pressure is set to be a reduced pressure of about 10 Torr, and the CuO film 4 is annealed at a temperature of 300° C. for 1 hour. In this manner, when the pressure is set to be low, oxygen can easily be removed from the CuO film 4, although the surface of the resultant Cu wiring layer is coarse. However, when the CuO film 4 is slowly reduced at a relatively low temperature for a long time, a Cu wiring layer consisting of high-purity Cu can he obtained.

Figure 8A:
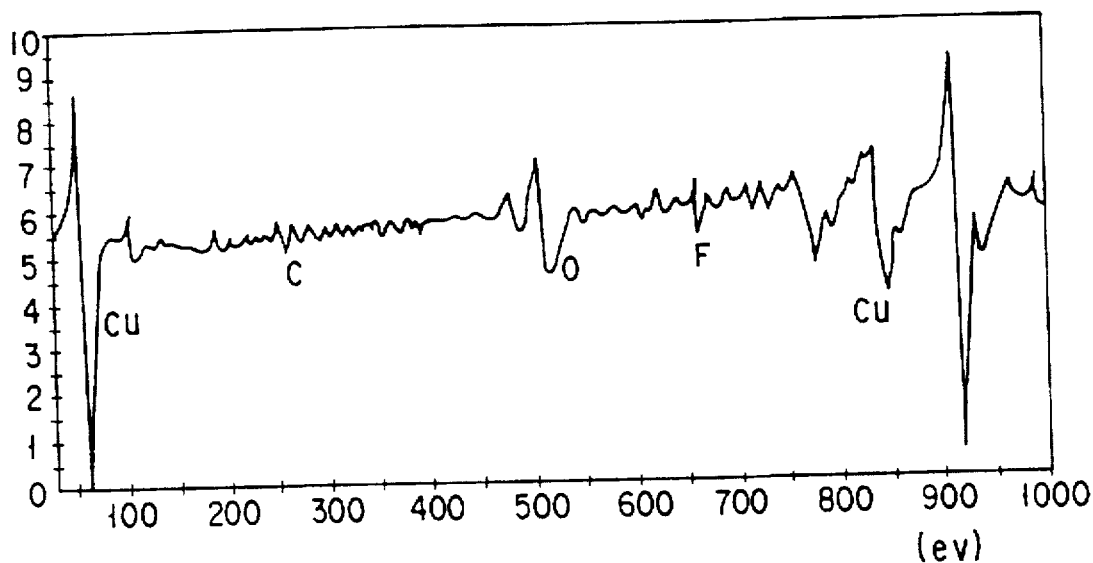
FIGS. 8A and 8B are graphs for explaining an effect of the present invention.
Figure 8B:
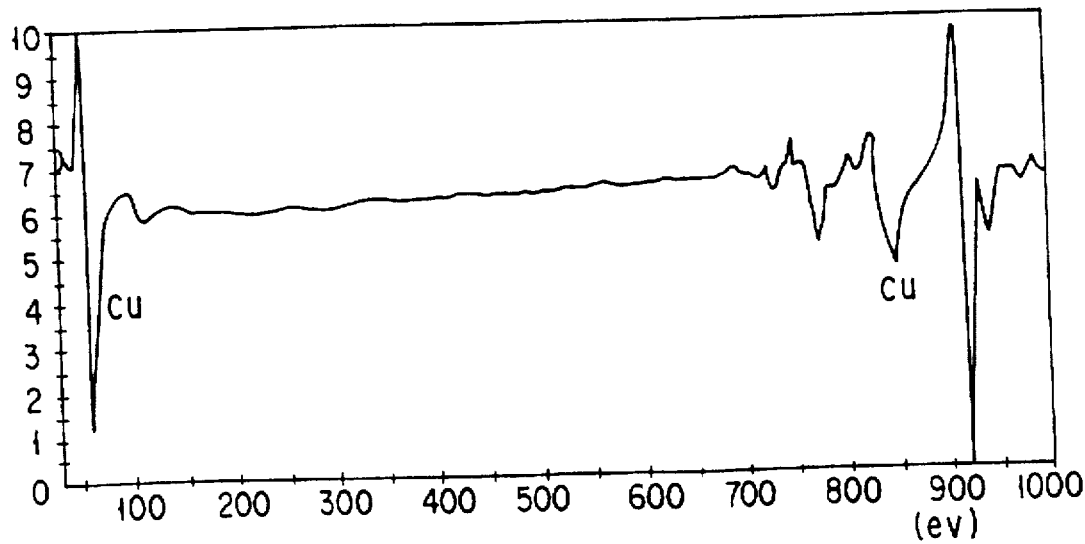

FIGS. 8A and 8B are graphs for explaining an effect of the present invention. FIG. 8A shows the Auger analysis result of a Cu film formed by a conventional method, i.e., CVD using H$_2$, and FIG. 8B is the Auger analysis result of a Cu film formed by the method according to this embodiment. According to FIG. 8A, it is understood that the Cu film obtained by the conventional method contains an impurity such as C or F. The resistivity of the Cu film was measured to be 16.3 μΩ/cm and was about 10 times the resistivity of a bulk-like Cu film. On the other hand, any impurity could not detected in the Cu film obtained by the method of this embodiment, and the resistivity of the Cu film was 1.82 µΩ/cm and equal to that of the bulk-like Cu film.

As described above, according to this embodiment, bonding between Cu and an impurity such as carbon or hydrogen is prevented by positively forming the CuO film 4, and the CuO film 4 is reduced to form the Cu wiring layer 5. For this reason, the Cu wiring layer 5 having original characteristics of Cu, i.e., a low electric resistivity and high EM and SM resistances. In addition, since CuO is a stable copper oxide, Cu atoms in the CuO film 4 are not diffused in the BPSG film 2. For this reason, a defective operation of an element formed in the semiconductor substrate 1 can be prevented.

According to this embodiment, the CuO film 4 except for the CuO film 4 in the groove 3 is removed by polishing so as to form a wiring pattern. For this reason, in this embodiment, problems caused by degradation of a resist pattern or ashing of the resist pattern are not posed.

FIGS. 9A to 9D are sectional views showing the steps in forming a metal wiring layer according to the second embodiment of the present invention.

Figure 9A:
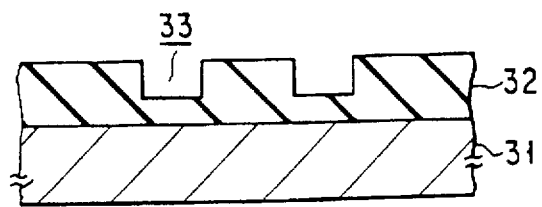
FIGS. 9A to 9D are sectional view showing the steps in forming a metal wiring layer according to the second embodiment of the present invention.
Figure 9B:
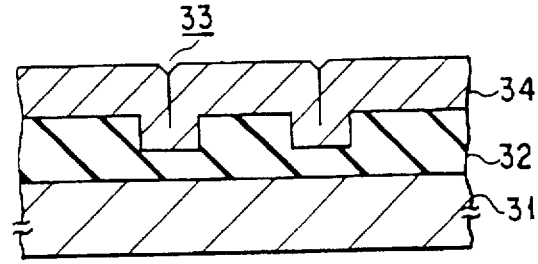

As shown in FIG. 9A, as in the first embodiment, a groove 33 having a width of 0.4 µm and a depth of 0.3 µm is formed in a Cu-diffusion prevention BPSG film 32 on a semiconductor substrate 31. As shown in FIG. 9B, a blanket-like CuO film 34 (metal oxide film) is formed on the entire surface of the resultant structure. The formation of the CuO film 34 is performed as follows by using a plasma CVD apparatus shown in FIG. 10.

First, the semiconductor substrate 31 is placed on an anode-side heater 37 in a chamber 36 having a pressure kept at 5 mTorr. The semiconductor substrate 31 is heated to 250° C. by the heater 37. A microwave from a microwave power supply 42 is guided to the chamber 36 through a matching box 41. An $O_2$ gas and $Cu(HFA)_2$ serving as a Cu organic source 39 are fed into the chamber 36. The $O_2$ gas is supplied at a flow rate of 50 sccm from a gas supply portion (not shown) into the chamber 36 through a pipe 43. On the other hand, the Cu organic source 39 is filled in a vessel 45 kept at 100° C., and the Cu organic source 39 is fed into the chamber 36, through a pipe 40 having a temperature kept at 150° C., by an Ar gas serving as a carrier gas and having a flow rate of 100 sccm.

The $O_2$ gas, $Cu(HFA)_2$, and Ar gas are mixed with each other by a shower nozzle 38 having holes arranged at predetermined intervals. A microwave activates the $O_2$ gas and decomposes the $Cu(HFA)_2$, so that the CuO film 34 is formed on the semiconductor substrate 31.

Figure 9C:
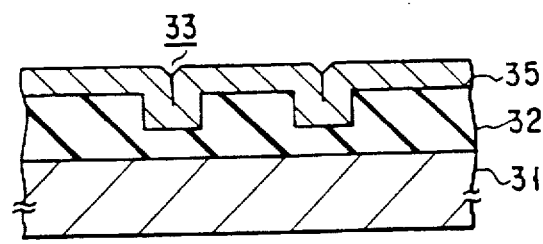
Figure 9D:
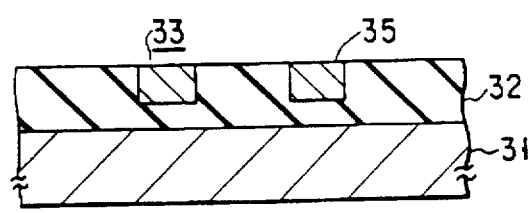

As shown in FIG. 9C, annealing is performed at a pressure of 10 Torr and a temperature of 400° C. for 30 minutes in a reducing gas atmosphere containing 100% of $H_2$ so as to reduce the CuO film 34, thereby forming a Cu film 35 having a thickness of about 0.4 µm. Finally, the Cu film 35 except for the Cu film 35 in the groove 33 is removed by polishing, thereby completing a Cu wiring layer 35 consisting of high-purity Cu and a low resistivity.

In the above-described method, the same effect as described in the first embodiment can be obtained. In the second embodiment, since polishing is performed after the CuO film 34 is reduced, even when the volume of the CuO film 34 is decreased, the groove 33 can be completely buried with the Cu wiring layer 35.

FIGS. 11A to 11E are sectional views showing the steps in forming a metal wiring layer according to the third embodiment of the present invention.

Figure 11A:
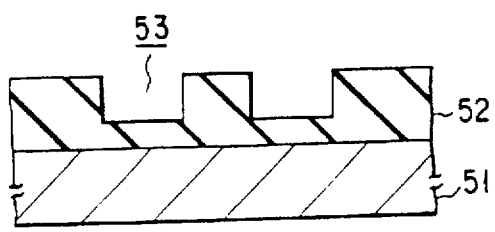
FIGS. 11A to 11E are sectional views showing the steps in forming a metal wiring layer according to the third embodiment of the present invention.
Figure 11B:
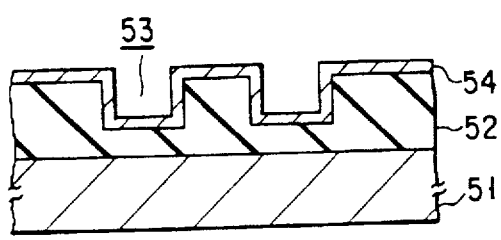

As shown in FIG. 11A, a silicon oxide film 52 having a thickness of 1.0 µm is deposited on a semiconductor substrate 51 consisting of silicon, and a groove 53 is formed in the silicon oxide film 52 by the same method as that of the first embodiment. As shown in FIG. 11B, a TiN film 54 serving as a barrier layer and having a thickness of 0.09 µm is deposited on the entire surface of the resultant structure by sputtering. The TiN film 54 suppresses diffusion of Cu into the semiconductor substrate 51 and improves adhesion properties with Cu and an effect of preventing Cu from being oxidized again. The barrier layer such as the TiN film 54 must be satisfy the following conditions. That is, diffusion into the metal barrier layer is rarely performed, metal atoms are not prevented from being gettered or diffused in the barrier layer. In addition, an amount of solid solution of the barrier layer is small in a metal, the barrier layer rarely produces a compound together with a metal, and the acid-resistance of the barrier layer is improved not to increase the electric resistivity of the barrier layer.

Figure 10:
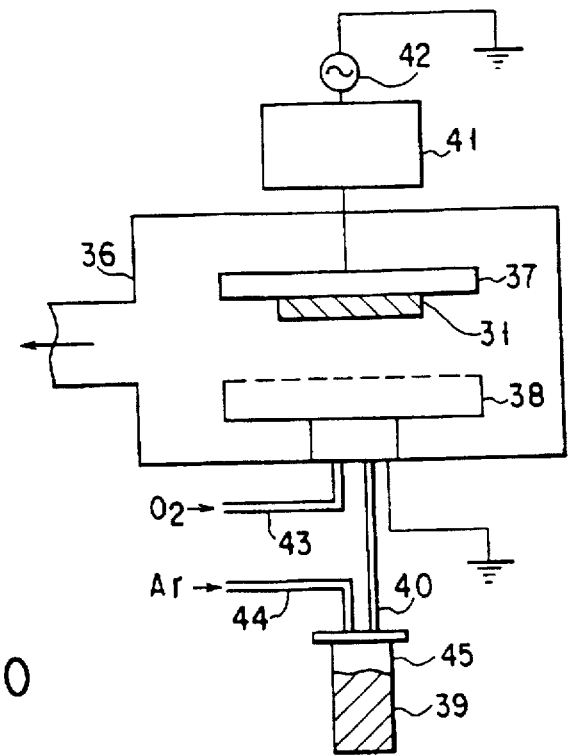
FIG. 10 is a schematic view showing the arrangement of a plasma CVD apparatus used in the second embodiment of the present invention.
Figure 11C:
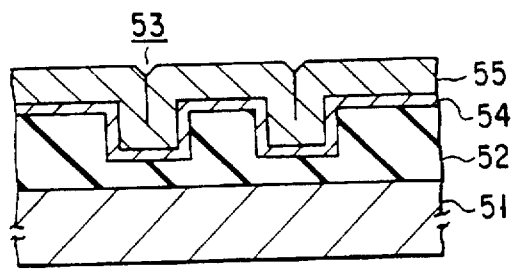
Figure 11D:
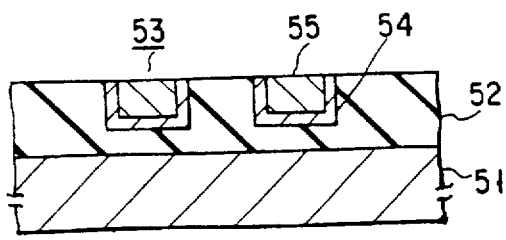
Figure 12:
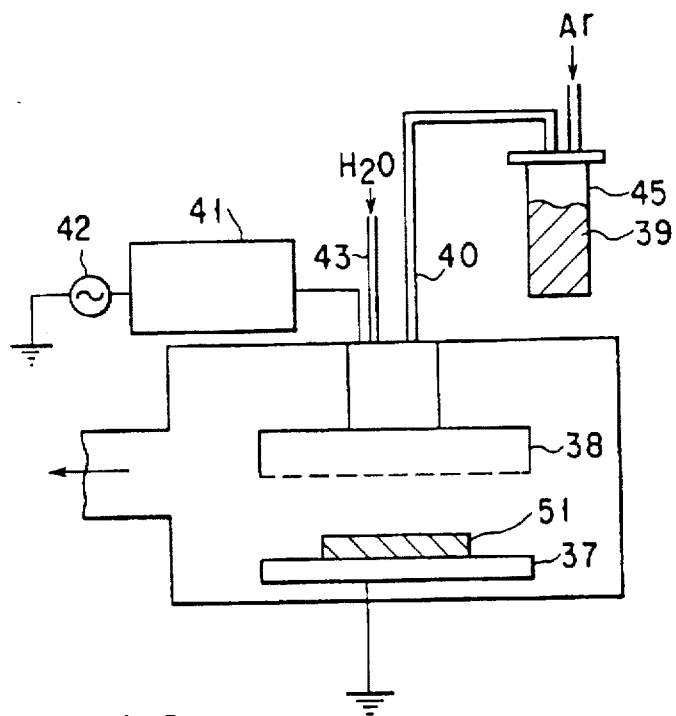
FIG. 12 is a schematic view showing the arrangement of a plasma CVD apparatus used in the third embodiment of the present invention.

As shown in FIG. 11C, a blanket-like CuO film 55 is formed on the entire surface of the resultant structure. The formation of the CuO film 55 is performed using a parallel-plate plasma CVD apparatus shown in FIG. 12. The same reference numerals as in the CVD apparatus in FIG. 10 denote the same parts in the CVD apparatus in FIG. 12. The different point between the CVD apparatus in FIG. 12 and the CVD apparatus in FIG. 10 is that the semiconductor substrate 51 is arranged on a cathode side and has more excellent directivity in FIG. 12. When an $H_2O$ gas is used as an oxidizing gas, and film formation is performed as in the second embodiment, the CuO film 55 having an oxygen content of 25% and a cubic system as a crystal structure is obtained. As shown in FIG. 11D, the CuO film 55 and the TiN film 54 are removed by polishing until the TiN film 54 is exposed except for the TiN film 54 in the groove 53 so as to leave the CuO film 55 in only the groove 53.

Figure 11E:
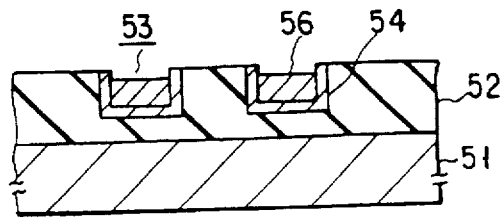

Finally, as shown in FIG. 11E, annealing is performed at a pressure of 750 Torr and a temperature of 500° C. for 30 minutes in a reducing gas atmosphere containing 100% of CO so as to reduce the CuO film 55, thereby completing a Cu wiring layer 56 surrounded by the TiN film 54.

In the above-described method, the same effect as in the first embodiment can be obtained, as a matter of course. In the third embodiment, since the TiN film 54 serving as a barrier layer is formed in the groove 53, diffusion of Cu atoms can be more effectively prevented, and the adhesion properties between the TiN film 54 and the wiring layer can be effectively improved.

FIGS. 13A to 13E are sectional views showing the steps in forming a metal wiring layer according to the fourth embodiment of the present invention. The different point between this embodiment and the third embodiment is that polishing is performed after a CuO film is reduced in this embodiment.

Figure 13A:
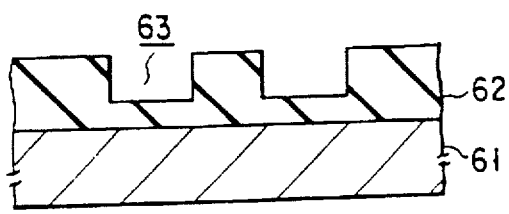
FIGS. 13A to 13E are sectional views showing the steps in forming a metal wiring layer according to the fourth embodiment of the present invention.
Figure 13B:
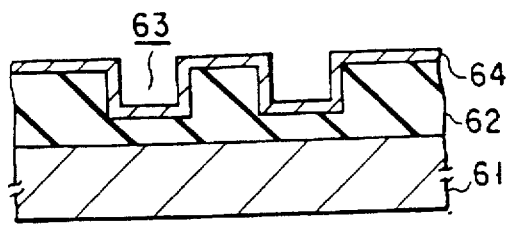
Figure 13C:
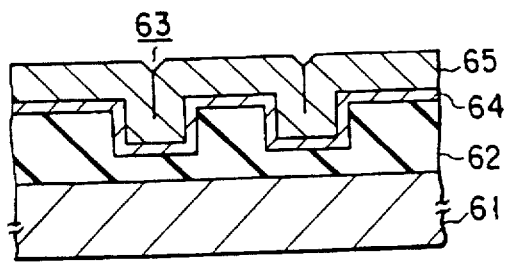

As shown in FIG. 13A, a silicon oxide film 62 having a groove 63 is formed on a semiconductor substrate 61, and, as shown in FIG. 13B, a TiN film 64 is formed on the entire surface of the resultant structure. As shown in FIG. 13C, a blanket-like CuO film 65 (metal oxide film) is formed on the entire surface of the resultant structure. The operations up to this are the same as those of the third embodiment.

Figure 13D:
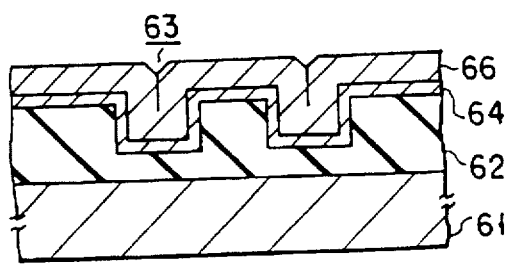
Figure 13E:
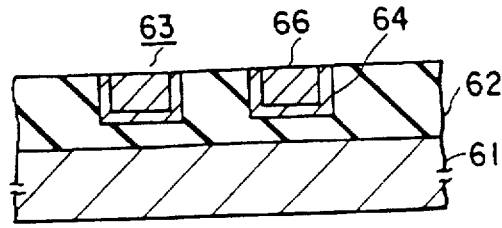

As shown in FIG. 13D, the CuO film 65 is reduced by annealing in a reducing gas atmosphere including a CO gas to form a Cu film 66. Finally, as shown in FIG. 13E, the Cu film 66 is polished to complete a Cu wiring layer surrounded by the TiN film 64.

In the above-described method, the same effect as in the third embodiment can be obtained, as a matter of course. In the fourth embodiment, since the CuO film 65 is polished after it is reduced, even when the volume of the CuO film 65 is decreased, the groove 63 can be completely buried with a Cu wiring layer 66.

FIGS. 14A to 14E are sectional views showing the steps in forming a metal wiring layer according to the fifth embodiment of the present invention.

Figure 15:
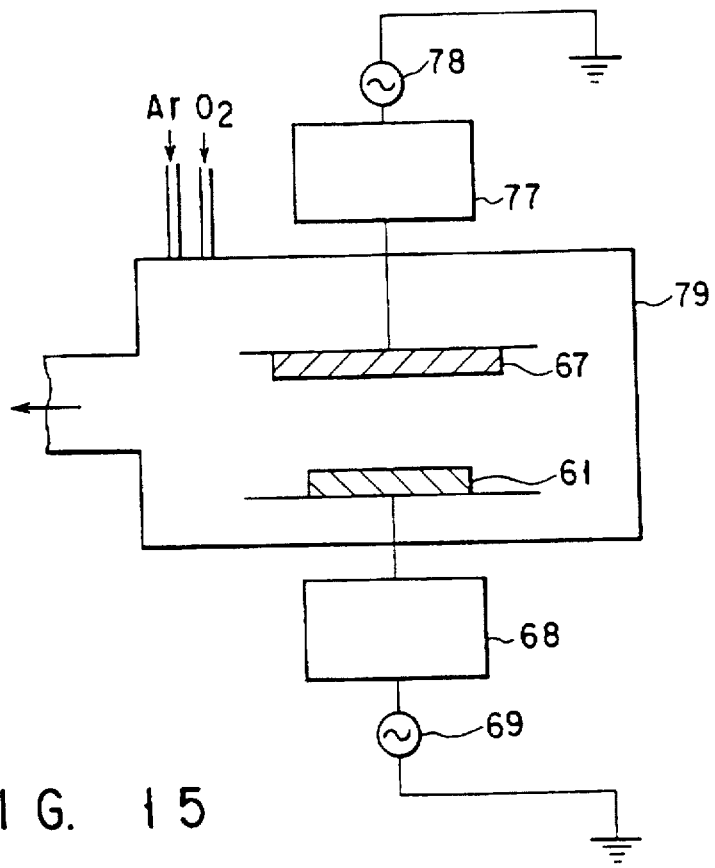
FIG. 15 is a schematic view showing the arrangement of a bias sputtering apparatus used in the fifth embodiment of the present invention.
Figure 14A:
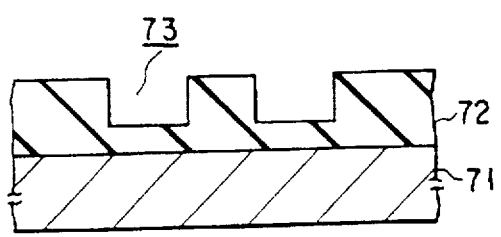
FIGS. 14A to 14E are sectional views showing the steps in forming a metal wiring layer according to the fifth embodiment of the present invention.
Figure 14B:
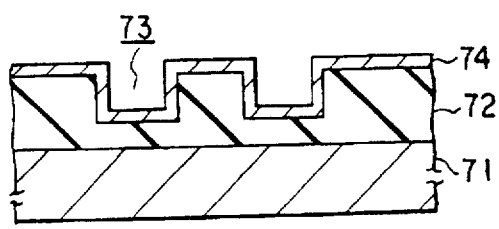
Figure 14C:
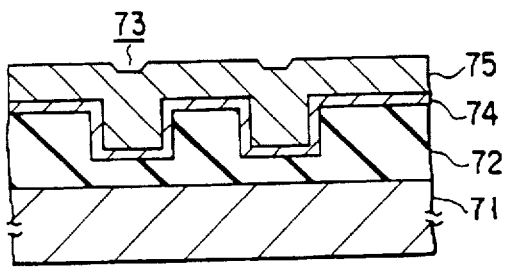

As shown in FIG. 14A, a silicon oxide film 72 having a thickness of 1.0 Åm is deposited on a semiconductor substrate 71 consisting of silicon, and a groove 73 is formed in the silicon oxide film 72. As shown in FIG. 14B, a TiN film 74 having a thickness of 0.1 µm is conformably formed on the entire surface of the resultant structure by CVD. Regardless of inside or outside of the groove, the film is formed uniformly at the same thickness. As shown in FIG. 14C, a CuO film 75 (metal oxide film) having an oxygen content of 35%, a thickness of 0.6 µm, and a cubic system as a crystal structure is formed on the entire surface of the resultant structure. The formation of the CuO film 75 is performed as follows by using a bias sputtering apparatus shown in FIG. 15.

A high-frequency voltage from a high-frequency power supply 78 is applied to a Cu target 67 through a matching box 77, and a high-frequency voltage from a high-frequency power supply 69 is applied to the semiconductor substrate 71 through a matching box 68, so that an RF bias voltage is applied across the Cu target 67 and the semiconductor substrate 71. At this time, an Ar gas (40 sccm) and an $O_2$ gas (40 sccm) are fed into a chamber 79 so as to sputter Cu. The pressure in the chamber is $1 \times 10^{-3}$ Torr. In this manner, the CuO film 75 having a shape shown in FIG. 14C is obtained. Note that the CuO film 75 may be formed by applying a DC bias to the semiconductor substrate 71. In addition, when deposition is to be performed by sputtering, only an Ar gas may be fed into the chamber 79. After a Cu film or a Cu rich film is deposited, the $O_2$ gas may be fed into the chamber 79, and the CuO film 75 may be continuously deposited by chemical sputtering.

Figure 14D:
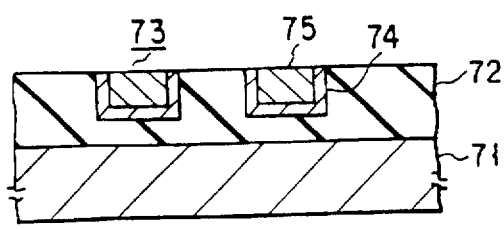
Figure 14E:
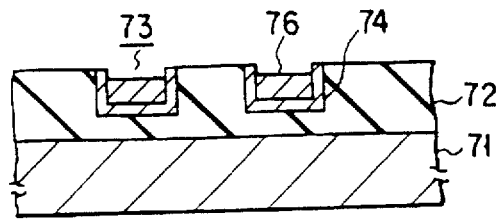

As shown in FIG. 14D, the CuO film 75 and the TiN film 74 are removed by an etch-back method until the silicon oxide film 72 is exposed except for the silicon oxide film 72 in the groove 73. Finally, as shown in FIG. 14E, annealing is performed for 30 minutes in a plasma containing a 100% of $H_2$ and having a pressure of 10 mTorr and a temperature of 200° C. so as to reduce the CuO film 75, so that a Cu wiring layer 76 having a low resistivity can be formed in a self-alignment form. In this method, the same effect as in the third embodiment can be obtained.

FIGS. 16A to 16E are sectional view showing the steps in forming a metal wiring layer according to the sixth embodiment of the present invention.

Figure 16A:
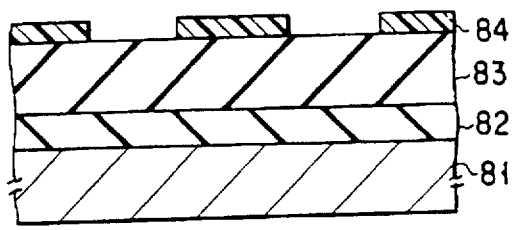
FIGS. 16A to 16E are sectional views showing the steps in forming a metal wiring layer according to the sixth embodiment of the present invention.
Figure 16B:
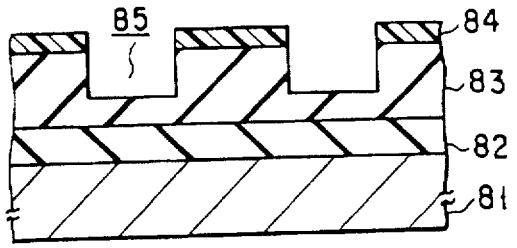

As shown in FIG. 16A, a silicon oxide film 82 is formed on a semiconductor substrate 81 consisting of silicon. An aluminum oxide film 83 having a thickness of 0.8 µm is formed on the silicon oxide film 82, and a photoresist pattern 84 is formed on the aluminum oxide film 83. As shown in FIG. 16B, the aluminum oxide film 83 is etched using the photoresist pattern 84 as a mask to form a groove 85 having a depth of 0.3 µm in the aluminum oxide film 83. Note that the pattern size of the photoresist pattern 84 is selected such that the width of the groove 85 is set to be 0.4 µm.

Figure 16C:
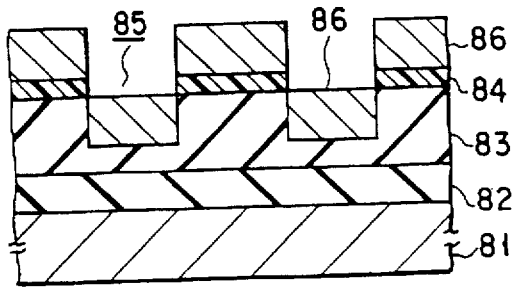

As shown in FIG. 16C, CVD is performed while controlling a direction so as to form a CuO film 86 on the entire surface of the resultant structure to bury the groove 85. The formation of the CuO film 86 is performed by using a parallel-plate plasma CVD apparatus shown in FIG. 12. As film formation conditions, a plasma is produced at a degree of vacuum of $10^{-4}$ Torr. In this manner, ions having good linearity can be produced, and film formation whose direction can easily be controlled can be performed.

Figure 16D:
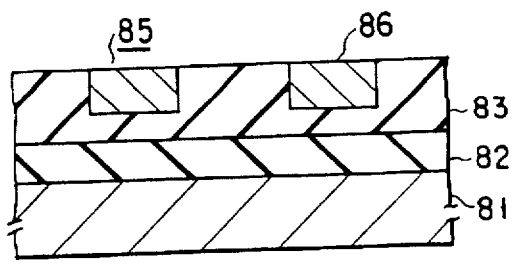
Figure 16E:
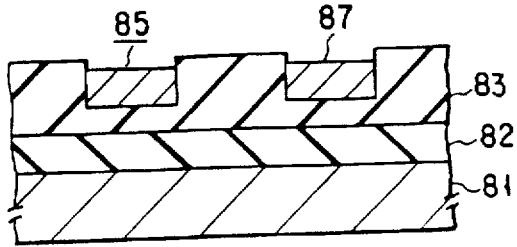

As shown in FIG. 16D, the semiconductor substrate 81 is dipped in an organic solvent, e.g., ethyleneglycol trimethyl ether, and the semiconductor substrate 81 is cleaned with an ultrasonic wave so as to lift off the photoresist pattern 84 and the CuO film 86 thereon. As a result, the CuO film 86 is left in only the groove 85. Finally, as shown in FIG. 16E, annealing is performed at a pressure of 1 atom a temperature of 500° C. for 30 minutes in a reducing gas atmosphere containing 20% of $H_2$ and 80% of $N_2$ so as to reduce the CuO film 86, thereby completing a Cu wiring layer 87.

Even when the method of removing the unnecessary CuO film 86 by the above lift-off operation is used, the Cu wiring layer 87 can be formed without causing an increase in electric resistivity. For this reason, the same effect as in the previous embodiment can be obtained.

FIGS. 17A to 17F are sectional views showing the steps in forming a metal wiring layer according to the seventh embodiment of the present invention.

Figure 17A:
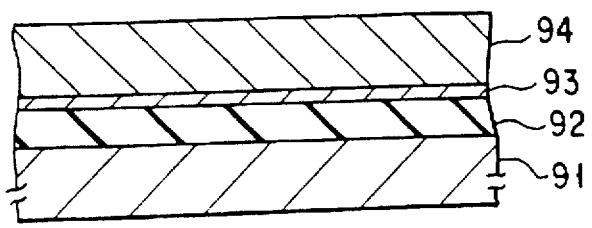
FIGS. 17A to 17F are sectional views showing the steps in forming a metal wiring layer according to the seventh embodiment of the present invention.

As shown in FIG. 17A, a silicon oxide film 92 is formed on a semiconductor substrate 91 consisting of silicon. A TiN film 93 having a thickness of 0.1 µm is formed on the silicon oxide film 92 by sputtering, and a CuO film 94 having a thickness of 0.6 µm is formed on the TiN film 93 by chemical sputtering. Note that a film such as an Nb film which functions as a barrier layer may be used in place of the TiN film 93.

Figure 17B:
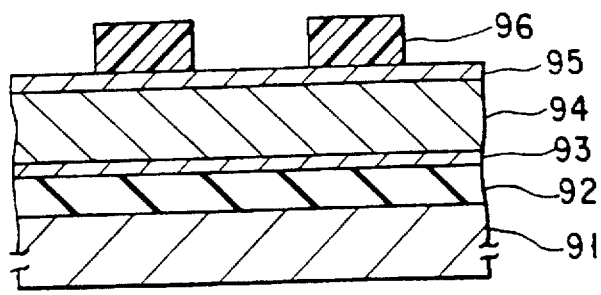
Figure 17C:
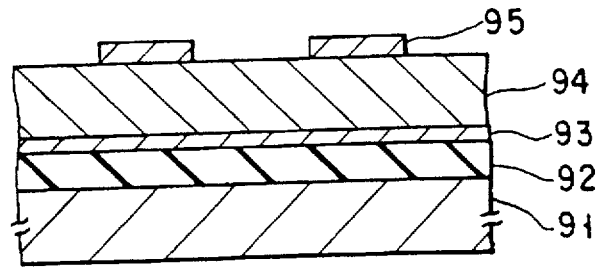
Figure 17D:
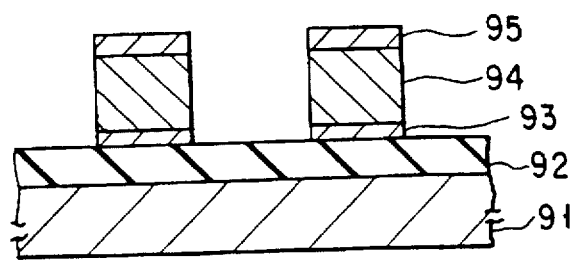

As shown in FIG. 17B, a carbon film 95 having a thickness of 0.04 µm is deposited on the CuO film 94 by sputtering, and a photoresist pattern 96 is formed on the carbon film 95. As shown in FIG. 17C, the carbon film 95 is etched by RIE using a $CF_4(CHF_3)+O_2$ gas and using the photoresist pattern 96 as a mask, and ashing of only the photoresist pattern 96 is performed by plasma downflow of $F_2$ and $O_2$ so as to be removed. As shown in FIG. 17D, the CuO film 94 and the TiN film 93 are etched using the patterned carbon film 95 as a mask. This etching is performed under the following conditions. That is, the temperature of the semiconductor substrate 91 is kept at 250° C., and a Cu oxychloride (metal halide) is produced by a synergetic effect of a plasma and a halogen-based gas such as a $Cl_2$ gas. Although the substrate temperature is set to be 250° C. in this embodiment, a temperature in the plasma may be set to be 250° C. or more.

Figure 17E:
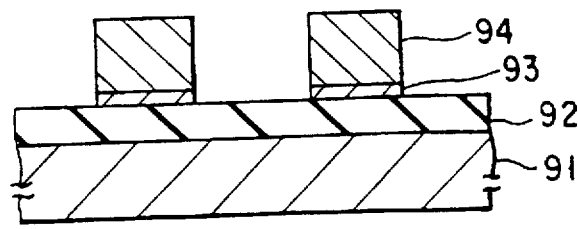
Figure 17F:
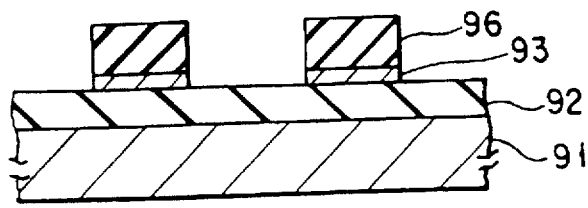

As shown in FIG. 17E, the semiconductor substrate 91 is exposed to an $O_2$ plasma and removed by ashing. As a result, a multi-layered wiring structure constituted by the CuO film 94 and the TiN film 93 can be obtained. Finally, as shown in FIG. 17F, annealing is performed at a pressure of 1 atom and a temperature of 500° C. for 30 minutes in a reducing gas atmosphere containing 20% of $H_2$ and 80% of Ar so as to reduce the CuO film 94, thereby completing a multi-layered wiring structure constituted by a Cu film 96 and the TiN film 93.

In the above-described method, the same effect as in the sixth embodiment can be obtained, as a matter of course. In the seventh embodiment, since the Cu film 96 is formed on the TiN film 93, diffusion of Cu atoms can be effectively prevented, and adhesion properties between the TiN film 93 and the Cu film 96 can be effectively improved. Note that the Cu film 96 may be formed by reducing the CuO film 94 in the step shown in FIG. 17A in place of forming the Cu film 96 by reducing the CuO film 94 in the step shown in FIG. 17F. In this case, in the step in FIG. 17C, etching of the Cu film 96 by RIE using the carbon film 95 as a mask is performed at a substrate temperature of 300° C. so that a Cu chloride is produced by a $Cl_2$ plasma. At this time, when the vapor pressure of a Cu halide or an oxygen halide is high, a gas containing another halogen such as fluorine or bromine may be used. In addition, the carbon film 95 may be left, or may be subjected to ashing by plasma downflow of $O_2$ and $F_2$ to be reduced by annealing. In any case, a Cu wiring layer consisting of high purity Cu can be formed. Since the carbon film has a higher heat-resistance than the resist layer, the underlying carbon film can still serve as a mask even if the overlying resist layer is deformed by etching.

FIGS. 18A to 18E are sectional views showing the steps in forming a memory cell according to the eighth embodiment of the present invention.

Figures 18A, 18B, 18C, 18D, 18E:
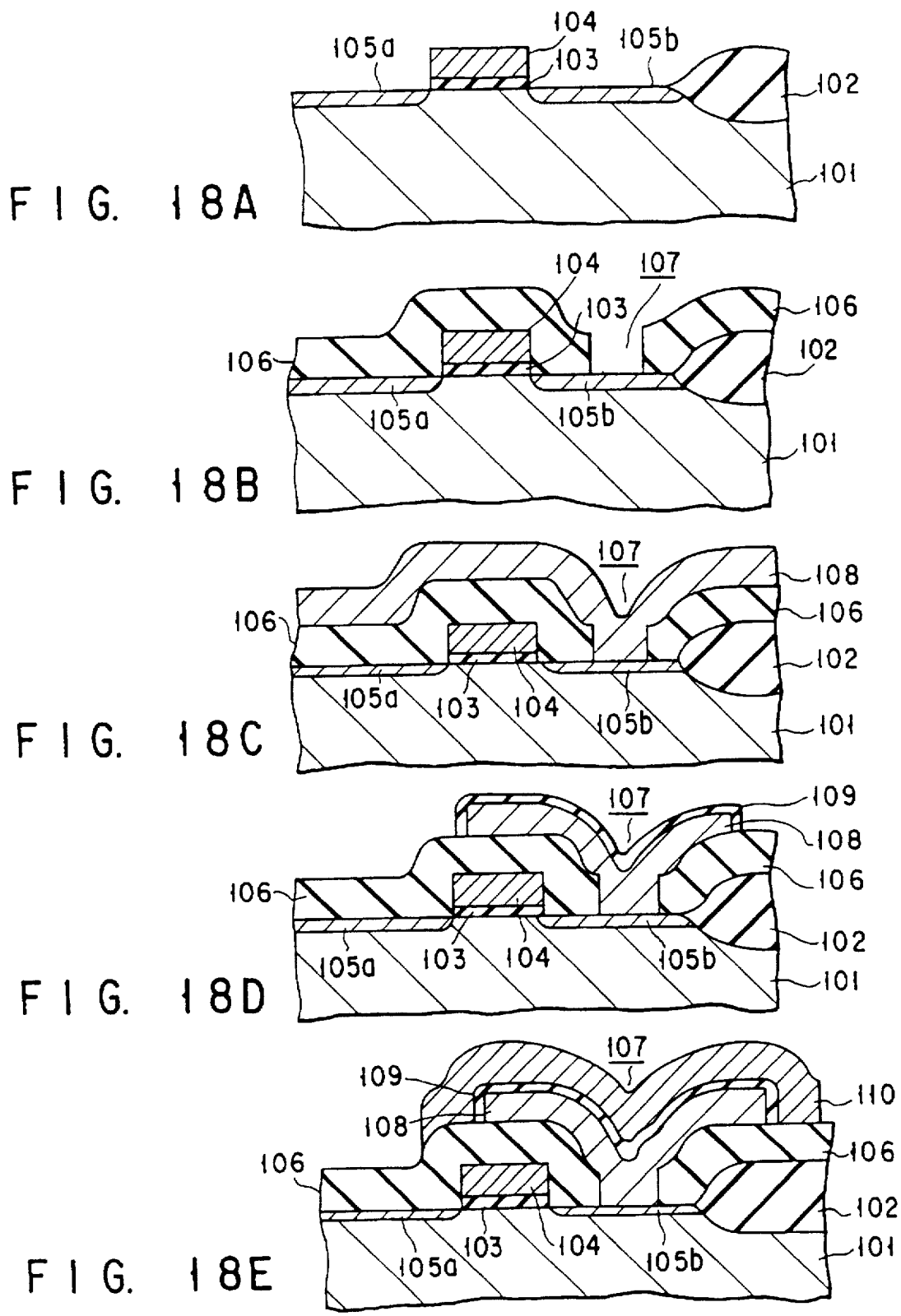
FIGS. 18A to 18E are sectional views showing the steps in forming a memory cell according to the eighth embodiment of the present invention.

As shown in FIG. 18A, a thermal oxidation film 102 is formed on a p-type semiconductor substrate 101 consisting of silicon by normal LOCOS so as to isolate an element. A silicon oxide film serving as a gate insulating film 103 and a first $n^+$-type polysilicon film serving as a gate electrode 104 are sequentially formed on the semiconductor substrate 101, and these films are patterned by photolithography and RIE so as to form the gate insulating film 103 and the gate electrode 104. Arsenic ions are implanted in the resultant structure using the gate electrode 104 as a mask so as to form an $n^+$-type source region 105a and a drain region 105b, thereby forming a MOSFET serving as a switching transistor.

As shown in FIG. 18B, a silicon oxide film 106 is formed on the entire surface of the resultant structure by CVD, and the silicon oxide film 106 on the drain region 105b is etched to form a storage node contact 107. As shown in FIG. 18C, a second $n^+$-type polysilicon film 108 is deposited on the entire surface of the resultant structure. As shown in FIG. 18D, the polysilicon film 108 is patterned in the form of a lower capacitor electrode by photolithography and isotropic etching, and a $Ta_2O_5$ film serving as a capacitor insulating film 109 is formed on the polysilicon film 108. The formation of the $Ta_2O_5$ film is performed by thermal CVD using $Ta(OC_2H_5)_5$ and $O_2$. Finally, as shown in FIG. 18E, an Ni film 110 serving as an upper capacitor electrode is formed, thereby completing a capacitor electrode having a multilayered structure. The formation of the Ni film 110 is performed as follows.

An NiO film is formed by CVD in which an $O_2$ plasma reacts with $Ni(ACAC)_2$. Annealing is performed at a temperature of 600° C. for 30 minutes in a reducing gas atmosphere containing 10% of $H_2$ and 90% of Ar so as to reduce the NiO film, thereby forming the Ni film 110. The Ni film 110 is patterned in the form of the upper capacitor electrode. Note that the reduction step and the patterning step may be performed in the reverse order.

According to the above-described method, the Ni film 110 which rarely contains an impurity can be obtained as the upper capacitor electrode. For this reason, an increase in resistivity of the upper capacitor electrode caused by an impurity can be prevented. When an application voltage having a predetermined level is applied to the upper capacitor electrode, a predetermined amount of charge can be reliably accumulated in the upper capacitor electrode. Therefore, an information error caused by the charge accumulated in the capacitor can be prevented. In this embodiment, although Ni is used as the material of the upper capacitor electrode, a metal material such as Pt or Pd having a large work function may be used in place of Ni.

In this embodiment, although the $Ta_2O_5$ film serving as the capacitor insulating film 109 is directly formed by CVD, the $Ta_2O_5$ film may be formed after a Ta film is formed and oxidized. That is, after the Ta film is formed, an NiO film is formed on the Ta film, and annealing is performed at 800° C. for 30 minutes in an Ar gas atmosphere to oxidize the Ta film and to reduce the NiO film. Thereafter, when the $Ta_2O_5$ film and Ti film are patterned by photolithography and RIE, a memory cell shown in FIG. 18E can be obtained. When the NiO film is insufficiently reduced, annealing may be additionally performed at about 500° C. in a reducing gas atmosphere containing $H_2$.

FIGS. 19A to 19E are sectional views showing the steps in forming a contact electrode according to the ninth embodiment of the present invention.

As shown in FIG. 19A, a thermal oxidation film 112 is formed on a p-type semiconductor substrate 111 consisting of p-type silicon by normal LOCOS to isolate an element. Arsenic ions are implanted in the substrate surface to form an $n^+$-type diffusion layer region 113. As shown in FIG. 19B, a silicon oxide film 114 is formed on the entire surface of the resultant structure by CVD. Thereafter, the silicon oxide film 114 on the diffusion layer region 113 is etched by photolithography and RIE to form a contact hole 115.

As shown in FIG. 19C, an NiO film 116 having a thickness of 50 nm is formed on the entire surface of the resultant structure by CVD. As shown in FIG. 19D, annealing is performed at 350° C. for 30 minutes in a reducing gas atmosphere containing 20% of $H_2$ and 80% of Ar so as to reduce the NiO film 116, thereby forming an Ni film 117 having a thickness of 40 nm. As shown in FIG. 19E, annealing is performed at 800° C. for 30 minutes in an $N_2$ gas atmosphere so as to silicify the Ni film 117 to form an $Ni_2Si$ film 118. In other words, in the annealing, the Ni film 117 on the diffusion layer region 113 side is converted into the $Ni_2Si$ film 118, and the Ni film 117 on the opposite side is converted into an NiN film. Thereafter, the non-reacted Ni film 117 and the NiN film are removed by wet etching. Finally, an Al alloy film is formed on the entire surface of the resultant structure by sputtering, and the Al alloy film is patterned in a predetermined form by photolithography and RIE so as to form a contact electrode 119, thereby completing the connection between the diffusion layer region 113 and the contact electrode 119.

According to the above-described method, since the $Ni_2Si$ film 118 rarely containing an impurity can be obtained, a contact resistance can be decreased. In this embodiment, after the Ni film 117 is reduced, the $Ni_2Si$ film 118 is silicified. However, the $Ni_2Si$ film 118 may be silicified simultaneously with the reduction of the Ni film 117. In addition, when a metal (e.g., Ni in this embodiment) having a decrease in standard free energy during formation of an oxide of the metal, which decrease is large than that of a decrease in standard free energy during formation of an oxide of a metal and silicon constituting the contact electrode 119, is used, a metal film consisting of a metal such as Ti, Mg, Li, or Ca may be formed on the NiO film, and annealing may be performed to the resultant structure to oxidize the metal film and to reduce the NiO film. That is, the Ni film is formed by reduction performed by annealing in a solid phase in place of the reduction performed by annealing in a gas atmosphere.

A metal such as V, Zr, Hf, Mo, Ti, Ta, or Cr having a large work function is preferably used as the material of the contact electrode 119 when an $n^+$-type diffusion layer is used, and a metal such as Pt, Pd, or Ir having a large work function is preferably used as the material of the contact electrode 119 when a $p^+$-type diffusion layer is used.

FIGS. 20A to 20E are sectional views showing the steps in forming a metal wiring layer according to the tenth embodiment of the present invention. A different point between the tenth embodiment and each of the first to ninth embodiments is that a solid-phase reducing agent is used in place of a gas-phase reducing agent in the tenth embodiment.

Figure 20A:
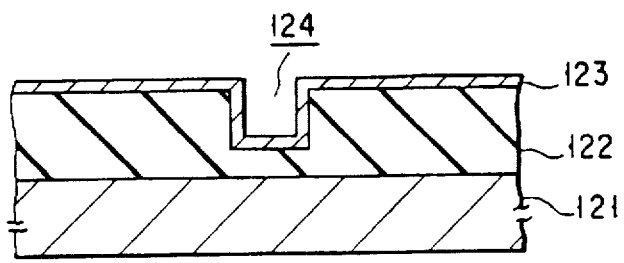
FIGS. 20A to 20E are sectional views showing the steps in forming a metal wiring layer according to the tenth embodiment of the present invention.
Figure 20B:
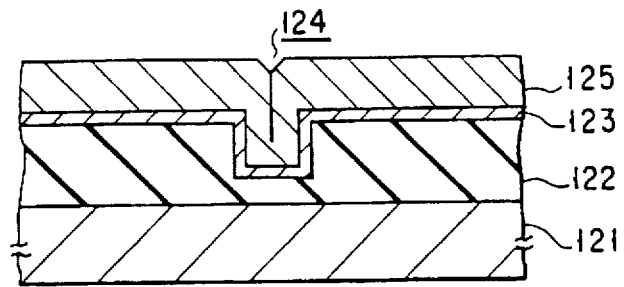
Figure 20C:
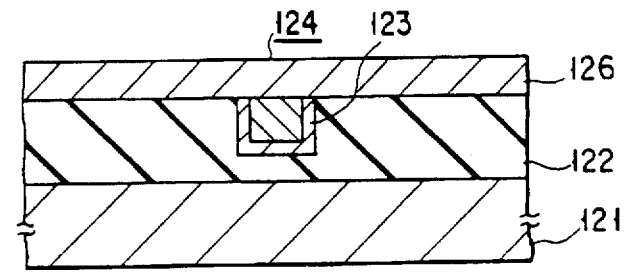

As shown in FIG. 20A, an $SiO_2$ film 122 is formed on a semiconductor substrate 121 consisting of silicon. A groove 124 is formed in the $SiO_2$ film 122, and an Nb thin film 123 having a thickness of 50 nm is formed as a barrier layer on the entire surface of the resultant structure. As shown in FIG. 20B, a CuO film 125 having a thickness of 600 nm is formed on the entire surface of the resultant structure by $H_2O$ plasma downflow CVD using $Cu(HFA)_2$ as a Cu organic source. As shown in FIG. 20C, the CuO film 125 and the Nb thin film 123 are removed by polishing until the Nb thin film 123 is exposed except for the Nb thin film 123 in the groove 124 to leave the CuO film 125 in only the groove 124. Thereafter, a Ti film 126 which functions as a reducing agent is deposited on the entire surface of the resultant structure.

Figure 20D:
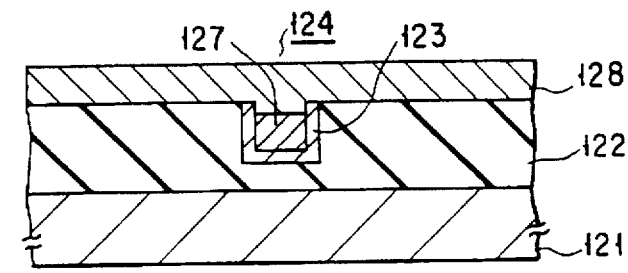
Figure 20E:
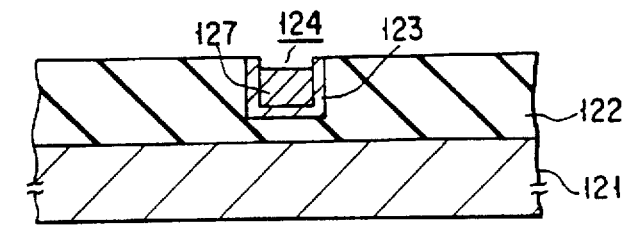

As shown in FIG. 20D, annealing is performed at a pressure of 1 atm, a temperature increase rate of 20° C./min, and at a temperature of 300° C. for 30 minutes in a gas atmosphere containing 90% of Ar and 10% of $H_2$, so that the CuO film 125 is reduced by the Ti film 126, thereby forming a Cu wiring layer 127 surrounded by the Nb thin film 123. At this time, the Ti film 126 is oxidized to be a TiO film 128. In this step, although the volume of the CuO film 125 is decreased, no gap is formed between the Cu wiring layer 127 and the groove 124. Finally, as shown in FIG. 20E, the TiO film 128 is removed by wet etching, thereby completing the steps in forming the Cu wiring layer 127.

In this embodiment, although the Ti film 126 is used to reduce the CuO film 125, a film consisting of V, Cr, Ni, or Nb may be used as a reducing agent. In addition, when a reducing metal such as Ni is used, the reducing metal film such as Ni film may be reduced by a reducing gas simultaneously with oxidation of the reducing metal. Note that the present invention is not limited to the above embodiments. For example, in the first to seventh embodiments, although the CuO film is reduced using hydrogen, the CuO film may be reduced using carbon or carbon monoxide in place of hydrogen. When carbon or carbon monoxide is used, chemical reaction formulas of the reduction of CuO are as follows:

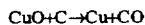

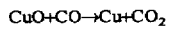

In the above first to seventh embodiments, although the CuO film is formed as a metal oxide film, a $Cu_2O$ film which is stable like the CuO film may be used. Chemical reaction formulas of the reduction of $Cu_2O$ are as follows:

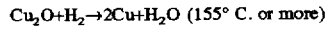

The CuO film preferably consists of a mixture of CuO molecules, Cu atoms, and O atoms, and preferably has a fine crystal structure or an amorphous structure as a crystal structure. Similarly, the $Cu_2O$ film preferably consists of a mixture of $Cu_2O$ molecules, Cu atoms, and O atoms, and preferably has a fine crystal structure or an amorphous structure as a crystal structure. The ratio between Cu atoms and O atoms does not have to be uniform throughout the film. For example, a structure in which the ratio of O atoms may increase in the upper part of the layer, is acceptable.

Formation of a copper oxide film such as the CuO film is not limited to the methods of the above embodiments, and the following methods may be used. That is, a gas such as a copper organic material or a copper chloride having a high vapor pressure and serving as a source gas and a gas such as an $O_2$ or $H_2O$ gas containing O are used, and these gases react with each other in a plasma. In addition, the CuO film may be formed by a reaction between a copper organic material or a copper chloride serving as a source gas and a gas such as an O radical or $O_3$ containing at least O. In this case, an oxygen plasma is fed from a substrate heating portion into a source gas upstream side, and the substrate temperature is preferably set to be 100° to 500° C. Alternatively, a copper oxide film may be formed by subjecting a Cu film formed in advance, to a heat treatment in a oxidizing atmosphere.

In the above embodiment, although a copper oxide film such as a CuO film is used as a metal oxide film, another metal oxide film such as a silver oxide film may be used in place of the copper oxide film. In this case, a film consisting of $Ag_2O$ or AgO which is relatively stable in silver oxides is preferably used. $Ag_2O$ or AgO is reduced at 100° C. or more in a reaction with hydrogen, and $Ag_2O$ or AgO is decomposed into an Ag metal and an oxygen gas at 110° C. or more.

In the above embodiments, as methods of forming a metal oxide film, parallel-plate plasma CVD, downflow CVD, and sputtering are used. However, the metal oxide film may be formed by deposition, plating, or oxidation combustion of an organic material containing a metal. For example, in the method using the deposition, an $O_2$ gas is fed by using a metal source, and chemical deposition is performed to form a metal oxide film, or a metal oxide film is directly formed using a metal oxide film as a source. In the plating, a metal oxide film is obtained by electroless plating or electroplating. In the oxidation combustion, an organic material containing metal is dissolved in an organic solvent, and the resultant solvent is coated on a substrate and forcibly subjected to oxidation combustion by a burner or a torch in an oxide gas atmosphere so as to obtain a metal oxide film.

Before the metal oxide film formed by one of the above methods is reduced, the following processing may be added. That is, the metal oxide film is annealed in an oxygen atmosphere to enhance oxidation of the metal oxide film, so that atoms (other than O atoms) bonded to metal atoms are substituted with O atoms. In this manner, an impurity such as C, F, or H in the metal can be removed to purify the metal. In addition, since the metal oxide film formed as described above is a solid film having a high density, a degree of purity of the film is more increased when it is reduced, thereby obtaining a metal film having a lower resistivity.

An underlying film for forming the metal oxide film is obtained as follows. That is, a silicon oxide film containing a material such as B or P having an effect of suppressing diffusion of Cu, a metal oxide film consisting of alumina or titania, or a metal film consisting of Al, V, Nb, Ag, Ti, or Ta may be independently used as a single layer, or a multi-layered structure may be formed by combinations of these films. A glue layer (adhesive layer) may be used to prevent the diffusion of Cu and to improve adhesion properties. V, Nb, and Ta in the above metals are not produce intermetallic compounds together with Cu, and these metals are diffused in the Cu film at high speed. For this reason, when the metals are deposited on the surface of the Cu film simultaneously with reduction of a Cu oxide, the Cu film can be self-passivated.

As methods of forming a wiring layer, a method of forming a wiring pattern from a metal oxide film to reduce the wiring pattern and a method of reducing a metal oxide film to form a wiring pattern have been described above. For example, a copper oxide is stabler to oxygen than metallic copper, and the copper oxide is can be easily polished because its hardness is about 3 times that of the copper. In addition, the method of forming a wiring pattern to reduce the wiring pattern can be performed by the simple steps because the vapor pressure of a copper halogen oxide is higher than that of copper halide in etching.

FIGS. 21A to 21G are sectional views showing the steps in forming a metal wiring layer according to the eleventh embodiment of the present invention.

Figure 21A:
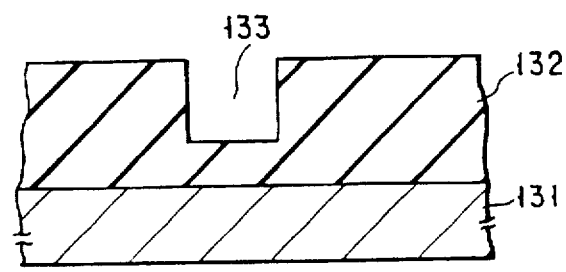
FIGS. 21A to 21G are sectional views showing the steps in forming a metal wiring layer according to the eleventh embodiment of the present invention.
Figure 21B:
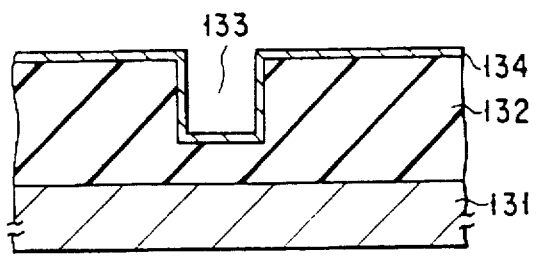
Figure 21C:
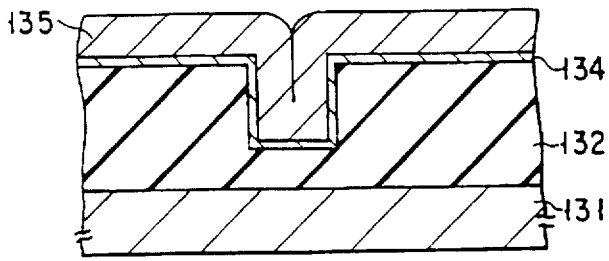
Figure 21D:
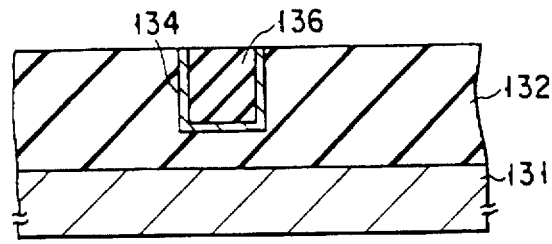

As shown in FIG. 21A, an $SiO_2$ film 132 is formed on a semiconductor substrate 131 consisting of silicon. The $SiO_2$ film 132 is processed to form a groove 133. As shown in FIG. 21B, an Nb film 134 having a thickness of 300 Å and serving as a metal layer for improving adhesion properties between a diffusion barrier and an underlying film is formed on the semiconductor substrate 131 in which the groove 133 is formed. As shown in FIG. 21C, plasma downflow CVD of $H_2O$ is performed using $(HFA)_2Cu$ as an organic source so as to form a CuO film 135 having a thickness of 6,000 Å. As shown in FIG. 21D, the resultant structure is subjected to lapping to form a CuO wiring layer 136 having a shape buried in the groove 133.

Figure 21E:
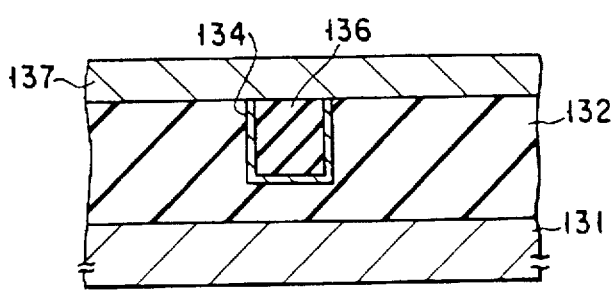
Figure 21F:
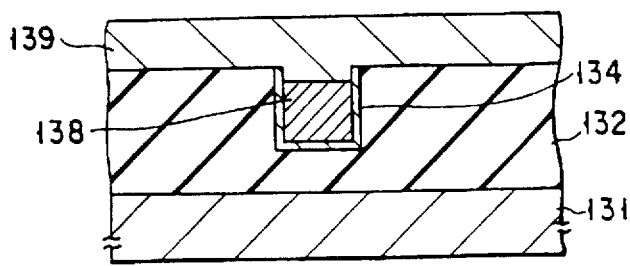
Figure 21G:
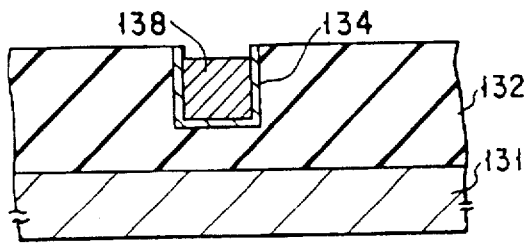

As shown in FIG. 21E, a Ti film 137 is formed on the semiconductor substrate 131. The resultant structure is annealed at a temperature increase rate of 20° C./min, a pressure of 1 atm, and a temperature of 300° C. for 30 minutes in an atmosphere containing 90% of Ar and 10% of $H_2$. At this time, as shown in FIG. 21F, the CuO wiring layer 136 is reduced to be converted into a Cu wiring layer 138, and the Ti film is oxidized to be converted into a TiO film 139. Since the volume of the Ti film is increased during the oxidation of the Ti film, even when the volume of the TiO film is decreased during reduction of CuO, no gap is formed between the Cu wiring layer 138 and the side walls of the groove 133. Finally, as shown in FIG. 21G, the TiO film 139 is removed by wet etching, and a Cu wiring layer can be formed.

In this embodiment, although Ti is used as a reducing agent for CuO, V, Cr, Ni, Nb, or the like may be used. In addition, during the annealing, a metal serving as a reducing agent may be reduced by the reducing gas simultaneously with oxidation of a reduced metal.

EXAMPLE 2

As a method of forming a groove in a semiconductor substrate to form a wiring layer in the groove, the following method is known. That is, a groove is formed in the substrate, a Cu film is formed on the entire surface of the substrate, the Cu film is left in the form of a blanket, and the left Cu film is polished to left the Cu film in only the groove. However, since a metal such as Cu is soft and has excellent ductility and malleability, the metal portion is more easily polished than the semiconductor substrate, and the semiconductor substrate cannot easily be flattened. In addition, the following method is known. That is, a film consisting of a metal such as W having a relatively high hardness is formed on the Cu film consisting of a soft metal so as to improve polishing characteristics, and the upper surface of the resultant structure is polished.

Figure 22:
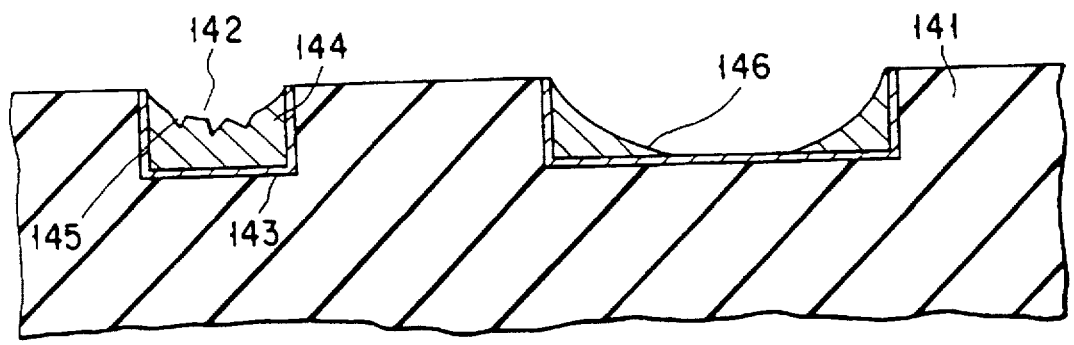

According to this method, problems shown in FIG. 22 are posed. That is, a groove 142 for forming a wiring layer is formed in the $SiO_2$ film 141 formed on a semiconductor substrate, and a barrier metal film 143 is formed thereon. A Cu film is formed on the barrier metal film 143, and the resultant structure is polished. In this manner, a Cu wiring layer 144 is formed, and scratches 145 are formed in the Cu wiring layer 144 by polishing particles during the polishing. In addition, a polishing rate depends on a pattern size, a so-called dishing phenomenon in which a recessed portion is formed at the central portion of the Cu wiring layer 144 occurs. At the portion where the dishing phenomenon occurs, an SM resistance is degraded due to concentration of a stress. In addition, a portion 146 having a small pattern width, the Cu wiring layer 144 is partially removed by the dishing phenomenon.

Figure 23:
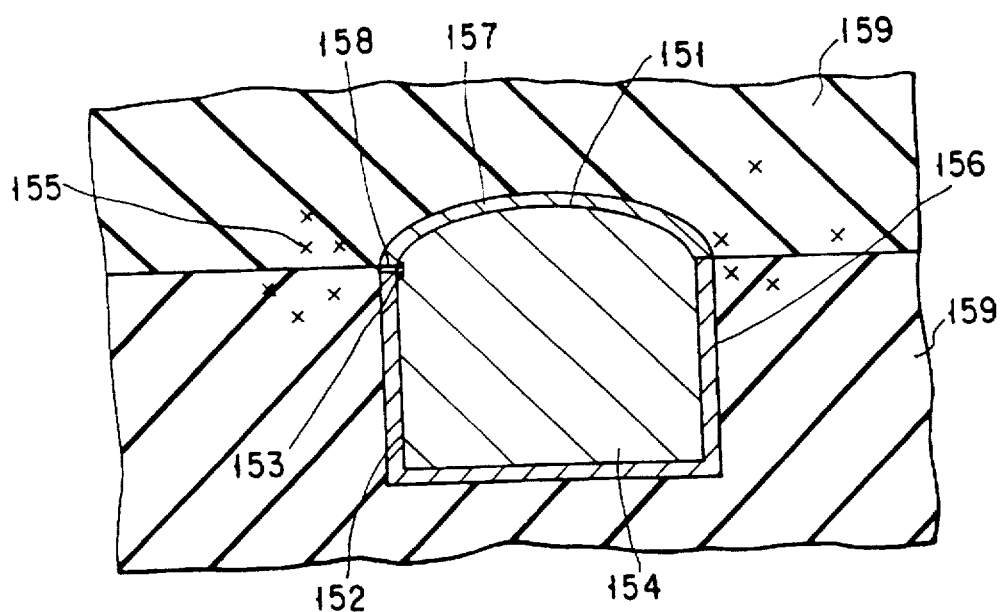

As shown in FIG. 23, a contact portion 153 between the upper surface 151 of a Cu wiring layer and a side wall 152 of a groove is located at an upper end of the groove. When the Cu wiring layer 154 has a shape projecting in the upper direction, Cu 155 which is a main component of the Cu wiring layer 154 is diffused from an interface 158 between a barrier metal 156 formed on the side surface and a barrier metal 157 formed on the upper surface of the Cu wiring layer into an insulating film 159, thereby causing a defective operation of an element and forming a short circuit between the wiring layers.

The twelfth embodiment of the present invention has the following characteristic feature. That is, when a metal oxide is reduced to a metal, the volume of the metal oxide is decreased, a wiring layer has a curved surface having a shape projecting in the upper direction due to metal coagulation caused by a surface tension. The wiring layer having the above shape rarely receives a concentrated stress to be resistant to stress migration. In addition, the wiring layer is stored in the groove, and the upper surface of the wiring layer is coated with a metal different from the metal of the wiring layer. For this reason, the length of a diffusion path of a metal is increased, diffusion of the metal can be suppressed.

Figure 24A:
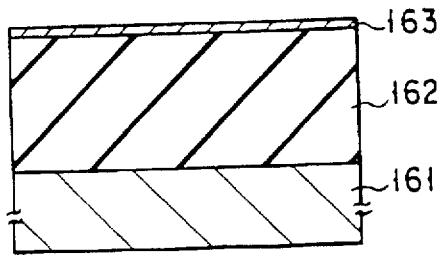
FIGS. 24A to 24H are sectional views showing the steps in forming a metal wiring layer according to the twelfth embodiment of the present invention.
Figure 24E:
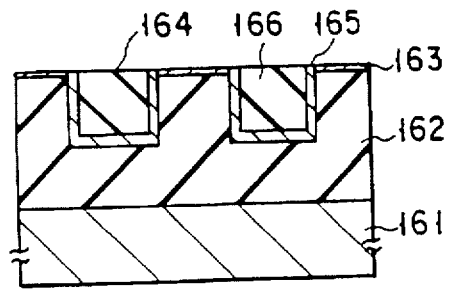
Figure 24B:
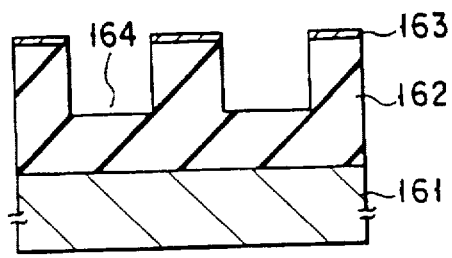

FIGS. 24A to 24H are sectional views showing the steps in forming a metal wiring layer according to the twelfth embodiment of the present invention. As shown in FIG. 24A, a thermal oxide $SiO_2$ film 162 having a thickness of 1.0 μm is formed on a semiconductor substrate 161 consisting of silicon, and a carbon (C) film 163 is formed on the thermal oxide $SiO_2$ film 162 by sputtering to have a thickness of 0.01 μm. A resist layer is formed on the $SiO_2$ film 162 by photolithography, the C film 163 and the $SiO_2$ film 162 are etched by RIE using the resist layer as a mask. Subsequently, ashing of the resist pattern is performed by a downflow plasma of fluorine and oxygen containing $H_2O$ so as to form a groove 164 having a width of 0.3 μm and a depth of 0.4 μm. In this manner, as shown in FIG. 24B, the C film 163 is left on only projecting portions of the $SiO_2$ film 162, and the groove 164 whose inside is defined by the $SiO_2$ film 162 is formed.

Figure 24F:
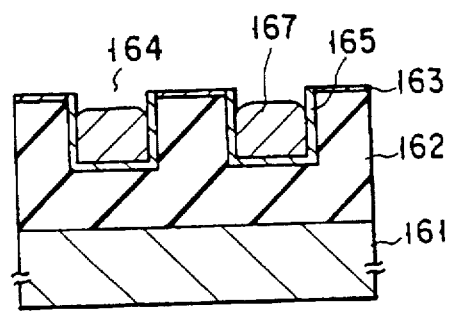
Figure 24C:
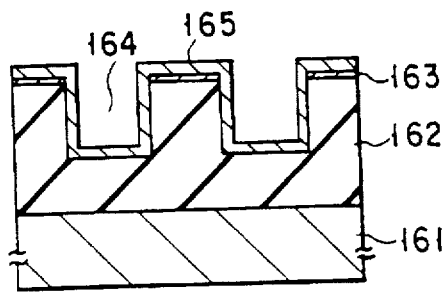
Figure 24G:
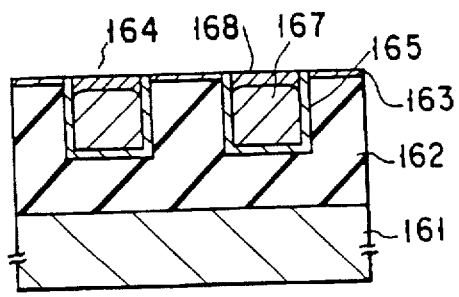
Figure 24D:
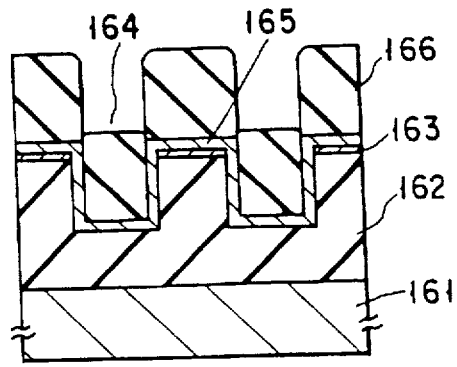

As shown in FIG. 24C, an Nb film 165 having a thickness of 0.04 μm is formed on the entire surface of the semiconductor substrate 161 by sputtering. As shown in FIG. 24D, a CuO film 166 having a thickness of 0.4 μm is formed by collimation sputtering. As shown in FIG. 24E, the CuO film is removed except for the CuO film formed in the groove 164 by polishing to form the CuO wiring layer 166. Note that, in the polishing of the CuO film and the Nb film 165, alkaline colloidal silica whose pH is about 8.5 is used as a polishing solution, and a relatively soft pad consisting of foamed polyurethane is used as a polishing cloth. A load acting on the semiconductor substrate during polishing is set to be about 30 g/cm², a supply rate of the polishing solution is set to be 200 ml/min, and rotational speed of the semiconductor substrate and a turntable is 100 rpm. At this time, the polishing rate of the CuO film is 0.8 μm/min. The C film 163 left on only the projecting portions of the $SiO_2$ film 162 is rarely polished under the above conditions, so that the carbon film 163 functions as a polishing stopper which stops the polishing at the position of the carbon film 163.

Figure 24H:
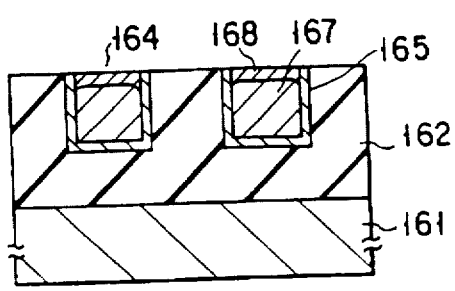

As shown in FIG. 24F, annealing is performed at 500° C. for 30 minutes in a reducing gas atmosphere containing 20% of $H_2$ and 80% of Ar so as to reduce the CuO wiring layer 166, thereby forming a Cu wiring layer 167. As shown in FIG. 24G, a W film 168 having a thickness of 0.05 μm is formed on only the Cu wiring layer 167 by selective CVD using $WF_6$ and $SiH_4$. At this time, when the W film 168 projects higher than that of the projecting portion of the $SiO_2$ film 162, an excessive W film may be removed by polishing to flatten the surface of the resultant structure. Finally, as shown in FIG. 24H, the C film 163 is removed by ashing using an oxygen plasma. The C film 163 may be reduced by an oxygen plasma before the CuO wiring layer 166 is reduced.

In the wiring layer formed as described above, as shown in FIG. 25, a groove 172 is formed in a $SiO_2$ film 171 formed on a semiconductor device, an Nb film 175 is formed on side surfaces 173 and a bottom surface 174 of the groove, and a W film 178 is formed on a upper surface 177 of the wiring layer. In this case, the contact point between the upper surface 177 of the wiring layer and the side surface 173 of the groove is represented by P, and the angle between the side wall 173 of the groove and a tangent line X of the upper surface 177 at the point P is represented by θ. An angle between the upper surface 177 and a tangent line Y at the vertex of the upper surface 177 is represented by θ'. At this time, the upper surface 177 has a shape projecting in the upper direction, and the point P must be located between an upper end Q and a low end R of the side wall 173 of the groove due the following reason. That is, the volume of the CuO film is decreased when CuO is annealed to be reduced into Cu, a force acts to decrease the surface area of the CuO film, the surface, i.e., the upper surface 177 of the wiring layer has an almost circular shape. For this reason, the point P is located between the upper and lower ends Q and R. In this case, the angles θ and θ' satisfy the conditions 0<θ<90° and θ<θ'.

According to the method described in this embodiment, for example, the angle θ is 16°, and the angle θ' is 47°. The angles θ and θ' depend on the adhesion properties between the metal of the wiring layer and the barrier metal and a method of forming a metal oxide, and can be properly changed. The upper surface 177 of the wiring layer has a curved shape projecting in the upper direction. However, the sectional shape of the wiring layer is close to a circle, a stress is easily concentrated on the wiring layer. In addition, when W which is a refractory metal is coated on the upper surface, a stress acting on the wiring layer itself can be decreased, and the wiring layer having excellent reliability can be obtained. In addition, when a metal different from the metal of the wiring layer is coated on the wiring layer to prevent diffusion of the wiring layer material, the interface between the wiring layer and the coated metal, i.e., a P-Q interval, is used as a diffusion path. According to this embodiment, diffusion is not more easily performed in the shape of the wiring layer according to this embodiment than the conventional shape in which P=Q is satisfied. In this manner, an electrode or a wiring layer having high EM and SM resistances and a low electric resistivity can be obtained. In addition, when the steps shown in FIG. 24A to 24H are repeated, a multi-layered wiring structure can be formed. In this example, the selective CVD method was employed for formation of the overlying W layer. It is also possible to use the electroless plating method. The material of the overlying layer is not limited to W, but may be Cr, Pd, or the like.

EXAMPLE 3

In formation of a conventional wiring layer, when Cu is used as a wiring material, Cu is diffused in an $SiO_2$ film at a very high rate. This diffusion poses a problem. As shown in FIG. 26, when a Cu wiring layer 183 is directly formed on an $SiO_2$ film 182 formed on the semiconductor substrate 181 as in a conventional Al wiring layer, diffusion of Cu atoms 184 into the $SiO_2$ film 182 is performed even at a low temperature (atmospheric temperature), and the Cu atoms 184 in the Cu wiring layer 183 are diffused into the deep portion of an insulating film to cause an operation error of an element.

Figure 27:
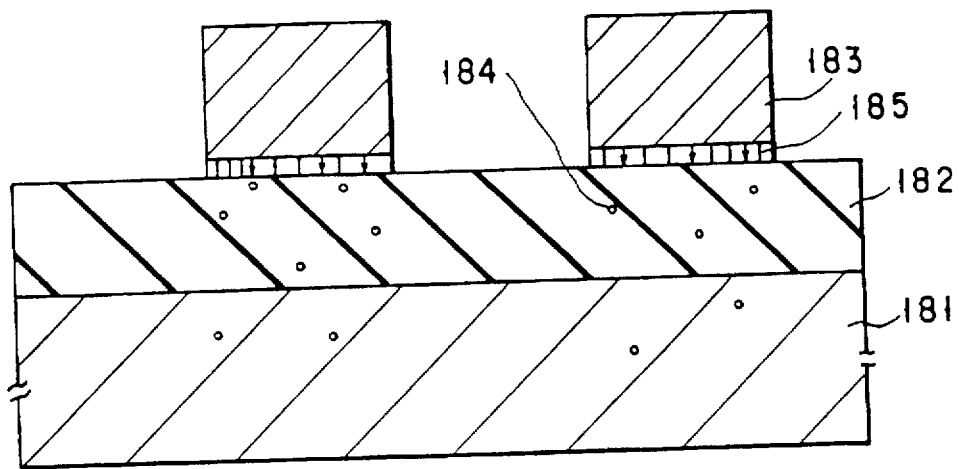

As a method of solving the above problem, as shown in FIG. 27, a method of forming a barrier metal 185, serving as a diffusion barrier, between the $SiO_2$ film 182 and the Cu wiring layer 183 is known. However, a barrier metal is generally polycrystalline, and the Cu atoms 184 are diffused from a crystal grain boundary into the barrier metal in a high-temperature step. This phenomenon occurs as in a buried wiring layer in a groove to pose a very serious problem.

The thirteen embodiment of the present invention has the following characteristic feature. That is, a metal or metal nitride layer serving as a barrier layer and an adhesion layer, and a metal oxide film to be used as a wiring layer or an electrode are formed on an insulating film formed on a semiconductor substrate. These layers and films are annealed in a reducing atmosphere to form the electrode or the wiring layer.

A metal or a metal nitride in the metal or metal nitride layer is polycrystalline, and diffusion is performed at a maximum rate in a crystal grain boundary. When a metal oxide is reduced to be a metal, some of oxygen atoms combining with metal atoms oxidize the crystal grain boundary of the metal or metal nitride layer by using the crystal grain boundary of the metal or metal nitride layer as a diffusion path. It is generally known that a metal oxide or a metal nitride has a crystal structure having a density higher than that of a metal so as to be used as an excellent barrier to diffusion. According to the present invention, since a grain boundary serving as a diffusion path is preferentially blocked, diffusion can be suppressed. In addition, at this time, oxidation of the barrier layer is performed along the crystal grain boundary. For this reason, the oxidation of the crystal of the barrier layer itself can be suppressed, and the diffusion can be suppressed without causing an increase in resistivity of a contact portion formed when a multi-layered wiring structure is formed.

FIGS. 28A to 28E are sectional views showing the steps in forming a metal wiring layer according to the thirteenth embodiment of the present invention. As shown in FIG. 28A, a thermal oxidation $SiO_2$ film 192 having a thickness of 1.0 Åm is formed on a semiconductor substrate 191 consisting of silicon, a resist pattern is formed on the $SiO_2$ film 192 by photolithography, and the film $SiO_2$ film 192 is etched by RIE using the resist pattern as a mask. Subsequently, ashing of the resist pattern is performed to form a groove 193 having a width of 0.3 μm and a depth of 0.4 μm. As shown in FIG. 28B, an Nb film 194 having a thickness of 0.04 μm is formed on the entire surface of the semiconductor substrate by sputtering.

As shown in FIG. 28C, a CuO film 195 having a thickness of 0.4 μm is formed by collimation sputtering. As shown in FIG. 28D, the CuO film 195 except for the CuO film 195 in the groove 193 is removed by polishing to form a CuO wiring layer 196. In the polishing of the CuO film 195 and the Nb film 194, alkaline colloidal silica whose pH is about 8.5 is used as a polishing solution, and a pad consisting of an unwoven fabric is used as a polishing cloth. A load acting on the semiconductor substrate during polishing is set to be about 100 g/cm$^2$, a supply rate of the polishing solution is set to be 200 ml/min, and a rotational speed of the semiconductor substrate and a turntable is 100 rpm. At this time, the polishing rate of the CuO film is 0.8 μm/min.

As shown in FIG. 28E, annealing is performed at 500° C. for 30 minutes in a reducing gas atmosphere containing 20% of H$_2$ and 80% of Ar so as to reduce the CuO wiring layer 196, thereby forming a Cu wiring layer 197.

Figure 29:
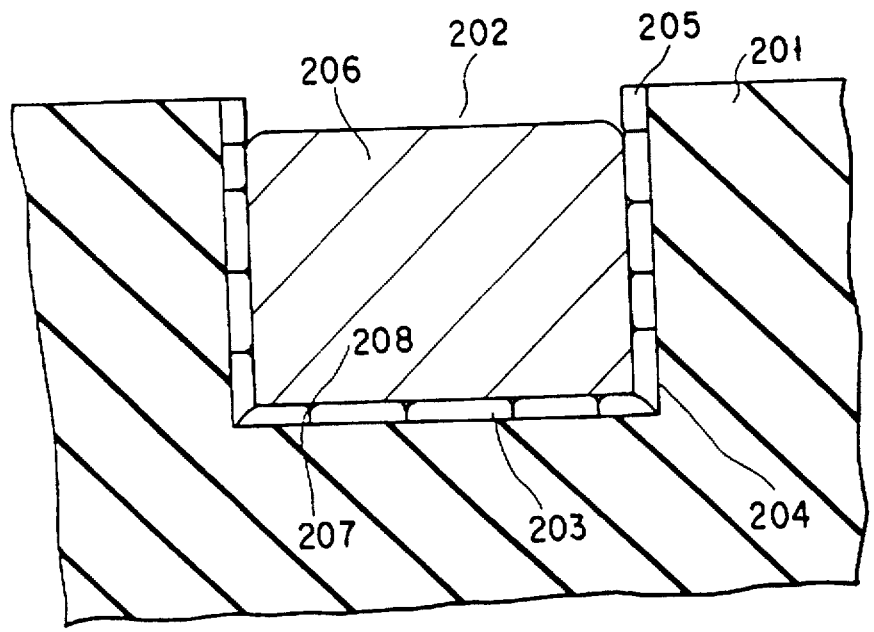
FIG. 29 is a sectional view showing a metal wiring layer obtained by the forming steps according to the thirteenth embodiment of the present invention.

In the wiring layer formed as described above, as shown in FIG. 29, an oxide film 202 is formed in an semiconductor substrate 201 formed on a semiconductor substrate, and a Cu wiring layer 505 is formed on side surfaces 203 and a bottom surface 204 of the groove. A Cu wiring layer 506 is formed in the groove. According to the method shown in FIGS. 28A to 28E, the NbO film 208 is formed at the crystal grain boundary of the Nb film 205.

Figure 31:
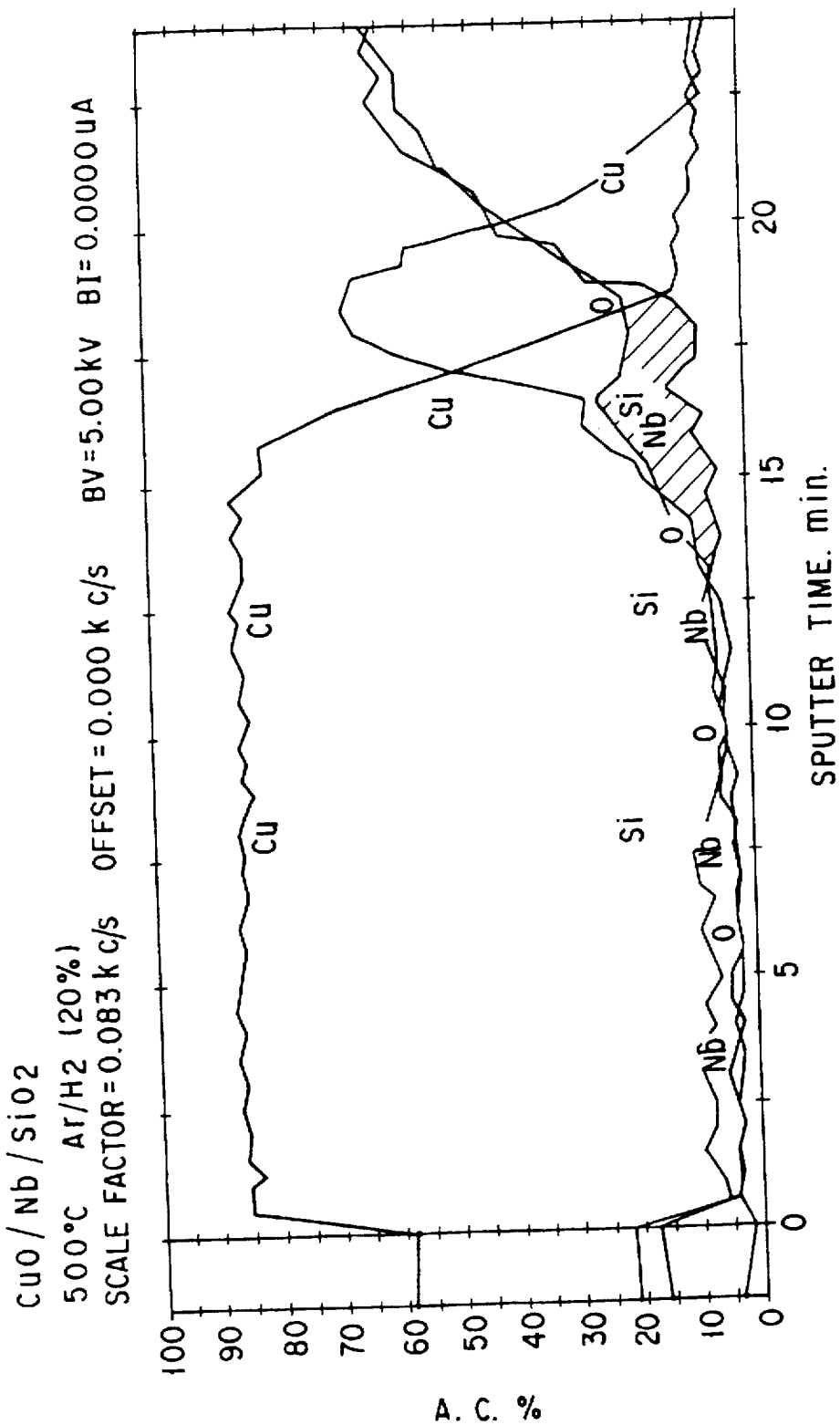
FIG. 31 is a graph showing an AES element analysis result in the direction of depth of a metal wiring layer obtained by the forming steps according to the thirteenth embodiment of the present invention.

FIGS. 30 and 31 show profiles in the direction of depth when a Cu/Nb/SiO$_2$ multi-layered thin film is subjected to an element analysis performed by an AES (Auger Electron Spectroscope). In each of FIGS. 30 and 31, the left side indicates a Cu layer serving as an uppermost layer, and the right side indicates an SiO$_2$ layer serving as an underlying layer. FIG. 30 shows the profile in the direction of depth of a wiring structure obtained by a conventional forming method, i.e., a wiring structure obtained by sequentially forming an Nb film and a Cu film on an SiO$_2$ film and annealing these films at 500° C. in an atmosphere containing Ar/H$_2$ (20%). On the other hand, FIG. 31 shows the profile in the direction of depth of a wiring structure obtained by a forming method according to the present invention. The wiring structure is formed as follows. That is, an Nb film is formed on an SiO$_2$ film, and a CuO film is formed on the Nb film, and these films are annealed at 500° C. in an atmosphere containing Ar/H$_2$ (20%) such that CuO is reduced to Cu.

In the wiring layer according to the present invention shown in FIG. 31, it can be detected that O is present on the surface of the Nb layer under the Cu layer, and it is understood the Nb surface is oxidized by reducing CuO. In the above conventional wiring layer and the wiring layer according to the present invention, diffusion of Cu into the SiO$_2$ films were investigated by an SIMS (Secondary Ion Mass Spectrograph). In this case, it was observed in the conventional wiring layer that Cu was diffused in the SiO$_2$ film during annealing at 850° C., but it was observed in the wiring layer according to the present invention that Cu was not diffused in the SiO$_2$ film during the above annealing. In the wiring layer according to the present invention, a contact resistance obtained when a multi-layered wiring structure was formed was equal to that of the wiring layer formed by the conventional method. An increase in resistivity caused by oxidation of Nb was not found. Note that, in addition to Nb, as a barrier metal, W, Mo, Cr, V, Ta, Ti, Zr, Hf, or the like can be obtained.

FIG. 32 is a sectional view showing a metal wiring layer according to the fourteenth embodiment of the present invention. A barrier metal (TiN 0.08 μm/Ti 0.02 μm) film 213 and a CuO film are formed on an SiO$_2$ film 212 formed on a semiconductor substrate 211 consisting of silicon, and these films are reduced to form a Cu layer 214 having a thickness of 0.03 μm. A wiring layer having a width of 0.3 μm and a thickness of 0.4 μm is formed by the Cu layer 214. This wiring layer is formed as follows. This is, a barrier metal film 213 and the CuO film are formed on the entire surface of the SiO$_2$ film 212, a resist is patterned by photolithography, and a CuO/TiN/Ti wiring layer is formed by RIE at 180° C. and an O$_2$ asher. Thereafter, the resultant structure is annealed in a reducing atmosphere to form the wiring layer. TiN serving as a barrier metal has a cylindrical polycrystalline structure, and a Ti oxynitride produced when CuO is reduced to Cu is present in the crystal grain boundary of TiN. In the wiring structure described in this embodiment, diffusion of Cu into the underlying layer can be suppressed at a rate higher than that of the prior art without causing an increase in contact resistance. In this manner, an electrode or a wiring layer having high SM and EM resistances and a low electric resistivity is obtained.

EXAMPLE 4

In the present invention, in formation of a CuO film under oxygen atmosphere using a sputtering method, a magnetron sputtering apparatus capable of forming a film at a high rate in a high-vacuum state can be obtained. In magnetron sputtering, since Cu atoms are sputtered onto a substrate from all directions, the shape of the film to be formed depends on an expected angle, and the film easily has the shape shown in FIG. 33. That is, when a CuO film 222 is formed on an insulating film 221 having a groove and formed on a substrate, the CuO film 222 has an overhang shape 223, and a void 224 is easily formed at the central portion of the groove. For this reason, the Cu film is not easily formed to be uniformly buried in the groove.

On the other hand, a method of uniformly burying a Cu film in a groove by so-called collimation sputtering is known. According to the collimation sputtering, a collimator is arranged between a sputtering target and a substrate, and sputtering is performed while a direction is controlled such that an incident angle of metal atoms on the substrate is close to 90° with respect to the substrate.

Figure 35:
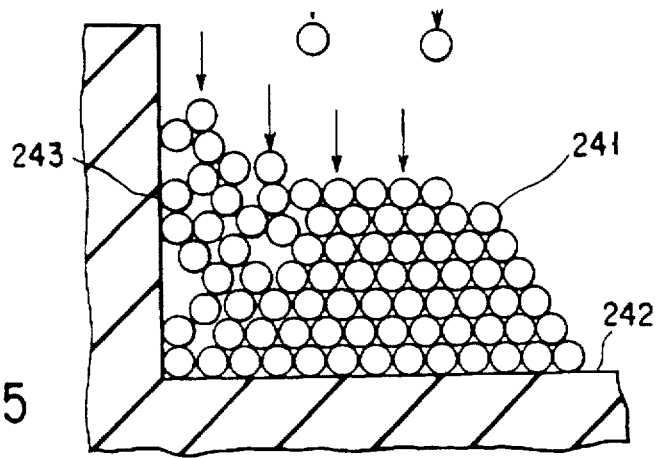
FIG. 35 is a view illustrating the deposition state of metal atoms in a groove.

However, when a CuO film is formed by this method, as shown in FIG. 34, a Cu film having a density equal to that of a CuO film 232 formed on a projecting portion of an insulating film 231 is formed at the central portion of a groove 233. However, since an incident angle of Cu atoms is close to 90° with respect to the substrate, a CuO film 234 having a low density is formed on each of the side wall portions of the groove. The etching rate of the CuO film 234 is considerably higher than that of the CuO film formed at the central portion of the groove, and a void is formed at each of the side wall portions of a wiring layer to be obtained, thereby degrading the reliability of the wiring layer. It was observed that a void is formed in the side wall portion of the wiring due to contraction also when CuO film is reduced to Cu film. FIG. 35 shows a state in which atoms are deposited on the substrate having a groove in the vertical direction. In this case, it is assumed that no atomic migration is present on the substrate surface. For example, CuO 241 are deposited, a highly dense surface is formed on a surface 242 parallel to the substrate to decrease the energy of the system, and the density of the film formed at this position is relatively high. In contrast to this, CuO are deposited at a low density on a surface 243 perpendicular to the substrate, thereby forming a film having a low density. This problem becomes serious in the step of burying a groove or a hole in manufacture of a VIA hole or a capacitor electrode.

In the fifteenth embodiment of the present invention, a thin film is uniformly formed on the side walls of the groove by swinging a substrate. That is, the substrate is swung, and atoms are deposited at a high density such that an angle i between the incident direction of the atoms (particles) and the substrate surface is close to 90°, thereby forming a film having a high density.

Figure 36A:
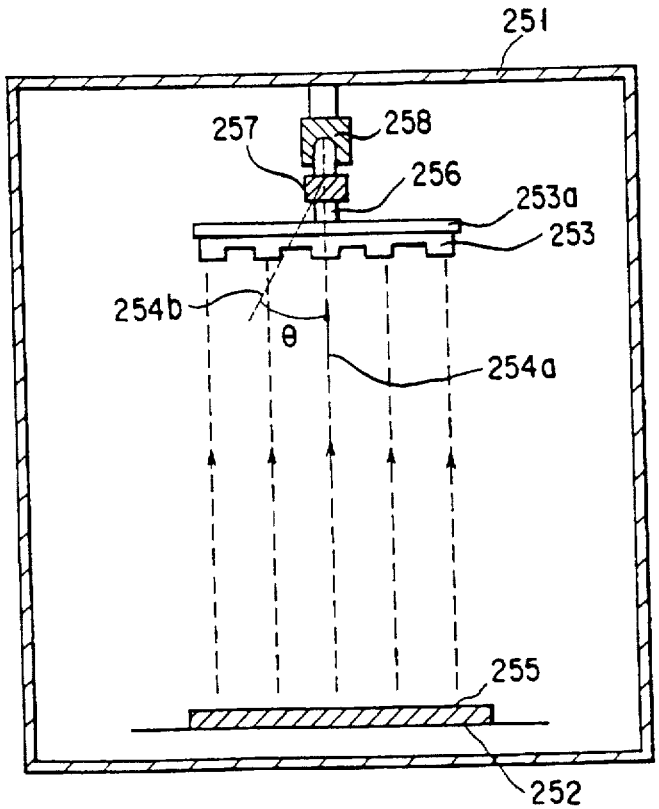
FIGS. 36A and 36B are schematic views showing a sputtering apparatus used in the fifteenth embodiment of the present invention.
Figure 36B:
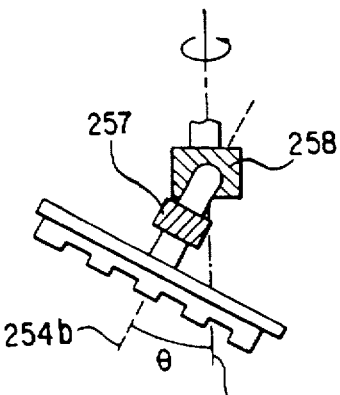

FIG. 36A is a schematic view showing a sputtering apparatus used in the fifteenth embodiment of the present invention. In FIG. 36A, reference numeral 251 denotes a vacuum chamber. A target 252 is arranged at the lower portion in the vacuum chamber 251. Above that, there is provided a substrate holder 253a such as to face the target 252, and further the semiconductor substrate 253 is fixed onto the substrate holder 253a by a static chuck (not shown). The distance between the target 252 and the semiconductor substrate 253 is set to be longer than that of the prior art, i.e., about 600 mm. In addition, the degree of vacuum in the vacuum chamber 251 is set to be 1/10 that of the prior art, i.e., about 0.03 Pa. In this manner, the incident direction of atoms sputtered from the target 252 onto the semiconductor substrate 253, as shown in FIG. 36, is almost perpendicular to a target surface 255. At this time, the semiconductor substrate 253 is swung.

In this case, the swinging operation means that an angle θ between the incident direction 254a of atoms and the direction 254b of the substrate central axis 256 is changed from 0° at a rate of 1° per second within a range of ±90° (excluding −90°), preferable within a range of ±45°, by means of the rotation motor 258, while the semiconductor substrate 253 is rotated at 10 rpm about a central axis 256 by the substrate central axis rotation motor 257, as shown in FIG. 35B. In addition, as a method of controlling the incident direction of atoms, collimation sputtering performed by inserting a collimator between the target 252 and the semiconductor substrate 253 may be used. Note that the rotational speed, inclination angle, and rotational frequency of the semiconductor substrate 253 can be properly selected. For example, the following method may be used. That is, the angle θ is changed from 0° within a range of ±45°, atoms are deposited on the side walls of the groove to some extent, and film formation is performed such that the angle θ is fixed to 90°. When the semiconductor substrate 253 is swung, the semiconductor substrate 253 may be rotated about its central axis 256, and the central axis 256 may be rotated (precession movement) around an axis perpendicular to the target surface 255 while gradually decreasing the above angle θ.

FIGS. 37A to 37D are sectional views showing the steps in forming a Cu wiring layer obtained by using the apparatus shown in FIG. 36. As shown in FIG. 37A, a groove 263 having a width of 0.6 μm and a depth of 0.4 μm is formed in an $SiO_2$ film 262 formed on a semiconductor substrate 261. An Nb film 264 having a thickness of 0.04 μm and serving as a Cu diffusion barrier is formed on the upper surface of the resultant structure. As shown in FIG. 37B, in the sputtering apparatus shown in FIG. 36, chemical sputtering is performed using a Cu target while an Ar gas and $O_2$ gas are fed, so as to form a CuO film 265 having a thickness of 0.04 μm. At this time no void was formed in the CuO film in the groove 263.

As shown in FIG. 37C, the CuO film 265 and the Nb film 264 are removed except for the CuO film 265 and the Nb film 264 in the groove 263 by CMP (Chemical Mechanical Polish) using colloidal silica so as to form a CuO wiring layer 266. At this time, no void was detected at the side wall portions of the groove 263. Finally, annealing is performed at 500° for 30 minutes in a reducing atmosphere containing 80% of Ar and 20% of $H_2$ at 1 atm so as to form a Cu wiring layer 267, as shown in FIG. 37D. The resistivity of the Cu wiring layer formed as described above was 1.8 μΩ/cm, and no void was not formed at the side wall portions of the groove.

In this embodiment, the steps in forming a Cu wiring layer has been described. However, the present invention can be applied to any method of forming a buried wiring layer using Al or Ag as a wiring material. In addition, when contacts between the layers of a multi-layered wiring layer are to be formed, a highly dense electrode can be formed without any void. In this manner, a wiring layer or an electrode having high EM resistance and high reliability can be formed.

EXAMPLE 5

The present inventors obtained the following findings as a result of studies on the constitution, reduction temperature, and hardness of a metal oxide film, particularly, a Cu oxide film.

Constitution of the metal oxide film

In the case of where a Cu oxide film has a uniform texture, the Cu oxide is not necessary composed of a stoichiometrically intermetallic compound but may be composed of a mixture of Cu atoms and O atoms. The crystal structure of the Cu oxide may be a microcrystalline structure or an amorphous structure. Further, the Cu oxide may be a stoichiometrically intermetallic compound, e.g., CuO (tenorite) having a distorted triclinic or monoclinic NaCl-type structure or $Cu_2O$ (cuprite) having a proto type of the cubic C3-type structure. Furthermore, Cu atoms or O atoms may be mixed with the aforementioned substances.

By way of example of forming the Cu oxide film, a method may be used in which a Cu oxide film is formed by the sputtering method or the CVD method while a Cu source and an O source are simultaneously being introduced. Another method may be employed in which a Cu film is formed first, and then exposed to an oxidative atmosphere to oxidize Cu, thereby forming the Cu oxide film.

Hereinbelow, the method of forming the Cu oxide film will be explained in detail with reference to the accompanying drawings.

FIGS. 38A to 38D are sectional views showing the steps of forming a metal wiring layer according to the present invention.

First, an $SiO_2$ film 272 serving as an insulating film is formed on a silicon substrate 271, as shown in FIG. 38A. In the $SiO_2$ film 272, a groove 273 functioning as a wiring layer or a hole working as a via-hole, is formed. On the resultant structure, a TiN/Ti film 274 is then formed, as shown in FIG. 38B. TiN/Ti film 274 functions as a barrier-layer which prevents diffusion of Cu atoms into the underneath layer. As a barrier-layer, a first layer made of at least one metal selected from the group consisting of Ti, Nb, W, Mo, Cr, V, Ta, Zr, and Hf, or a laminated layer of said first layer and a second layer made of nitride of at least one metal selected from said group may be used.

On the TiN/Ti film 274, a Cu film 275 is formed. Cu is then oxidized by heat treatment for 10 minutes at 200° C. under reduced pressure of 10 Torr in an $O_2$ atmosphere, thereby forming a Cu oxide film 276 on the top-surface layer. By this heat treatment, the portion of the insulating film other than in the groove and the Cu film 275 in a degree of 20% in the groove 273 are also oxidized, as shown in FIG. 38C. In this case, the usable oxidative atmospheres employed in place of $O_2$, may be $H_2O$, O ions, O radicals and the like. Subsequently, polishing is applied to the resultant oxide film to allow the Cu film 275 and the Cu oxide film 276 to remain in only the interior portion of the groove 273, as shown in FIG. 38D. Thereafter, heat-treatment is performed at about 450° C. under normal atmospheric pressure (1 atm ) in a hydrogen atmosphere (e.g., $H_2$ gas:100%), as shown in FIG. 38E, thereby forming a Cu wiring layer 277 in the groove 273. The upper surface of the Cu wiring layer has a convex curvature. The Cu wiring layer 277 is also excellent in SM resistance and EM resistance and low in electric resistance.

Although the Cu film 275 in the groove 273 is partially oxidized in the example, the Cu film 275 in the grove 273 may be subjected to a reduction step without being oxidized (but after only the upper layer thereof is oxidized).

Figure 39:
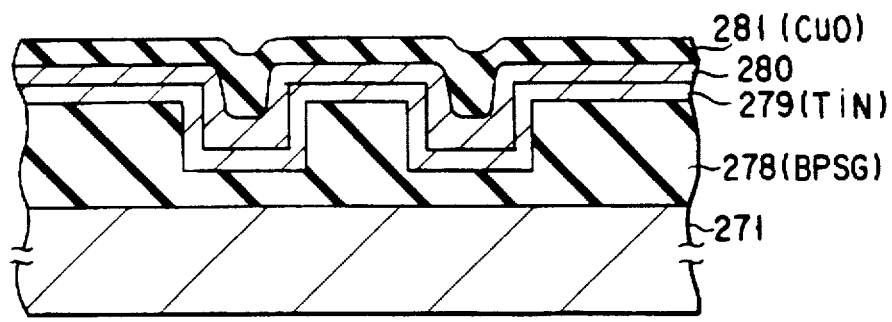
FIGS. 39 and 40 are sectional views showing other embodiments of a metal wiring layer according to Example 5.
Figure 40:
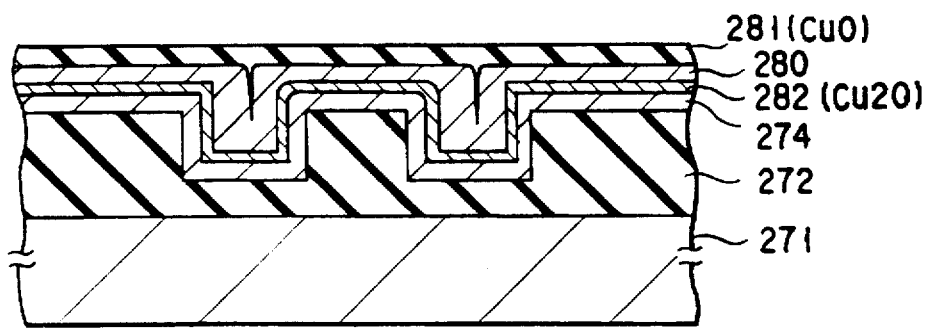

In forming Cu oxide film on the top-surface layer, the Cu oxide film may be formed by the following two steps as shown in FIG. 39: first, a Cu film 280 is formed on a TiN film 279 placed on a BPSG film 278 by the sputtering method or the CVD method, in a Cu film formation apparatus. The resultant film structure is then removed from the apparatus and placed in a Cu oxide-film formation apparatus. In this apparatus, a Cu oxide film 281 is formed by the sputtering method or the CVD method. Alternatively, two types of Cu oxide films may be continuously formed in the same film formation apparatus by introducing an oxidation gas such as $O_2$ gas in the middle of the Cu film formation step. Furthermore, the Cu oxide film may be formed as shown in FIG. 40. That is, a thin Cu oxide film 282 is formed on the barrier-layer 274. The Cu film 280 is formed on the thin Cu oxide film 282, and the Cu oxide film 281 is formed on the Cu film 280. In the case of an example shown in FIG. 40, when reduction treatment is performed in a later step, after film present in the portion other than the internal portion of the groove is removed, oxygen present in the Cu oxide film 282 on the barrier-layer 274 oxidizes the surface of the barrier layer 274. As a result, an effect on preventing Cu diffusion is improved.

Reduction temperature of the metal oxide film

Table 3 shows the lowermost reduction temperatures of Cu oxides and Ag oxides. Values of this Table indicate the lowermost reduction temperatures of the heat treatments conducted under normal atmospheric pressure (1 atm ) in CO gas (100%) and $H_2$ gas (100%).

TABLE 3

|  | CO | $H_2$ |
| --- | --- | --- |
| CuO | 265° C. | 250° C. |
| $Cu_2O$ | 200 | 155 |
| AgO | 100 | 80 |
| $Ag_2O$ | 140 | 100 |

On the other hand, the uppermost reduction temperature is determined by grooving and agglomeration phenomena of a metal such as Cu, and a diffusion phenomenon of Cu atoms into the underneath layer. The electrode wiring layer for use in a semiconductor device has a thickness of at most several ten μm. Even in an electric source wiring layer called a global wiring layer, the thickness thereof is only several μm. The surface layer of such a thin Cu film and an Ag film, unlike an Al film, does not obtain a passive state, so that the grooving and agglomeration causing surface roughness are likely to be caused by surface diffusion and surface tension when the heat treatment for reduction is performed. The thinner the film thickness and the higher the heat temperature, the more frequently the aforementioned phenomena occur. For example, when a $Cu_2O$ film having a thickness of 2.3 μm is reduced at a temperature of 450° C., a Cu film having a thickness of 2 μm is obtained. However, when the $Cu_2O$ film is reduced at a temperature of 850° C., agglomeration occurs. As a result, the electrode wiring layer desired by the present invention cannot be attained. Further, in the case where a device having a lowermost film thickness in the order of submicron is formed by employing Cu or Ag as a wiring material, the uppermost temperature for reducing Cu or Ag without causing grooving or agglomeration is 500° C.

As a next step, an uppermost reduction temperature is determined from the standpoint of a diffusion phenomenon of Cu atoms. Cu atoms are diffused rapidly in $SiO_2$ and Si and deposited in the form of solid solution or a compound at a lattice position or inter-lattice position. As a result, the formation of a generation/disappearance center of minor carriers of the semiconductor device, an increase of a leak current of pn junction, a short life of excessive carriers occur, leading to deterioration of electrical characteristics of the device.

Figure 41:
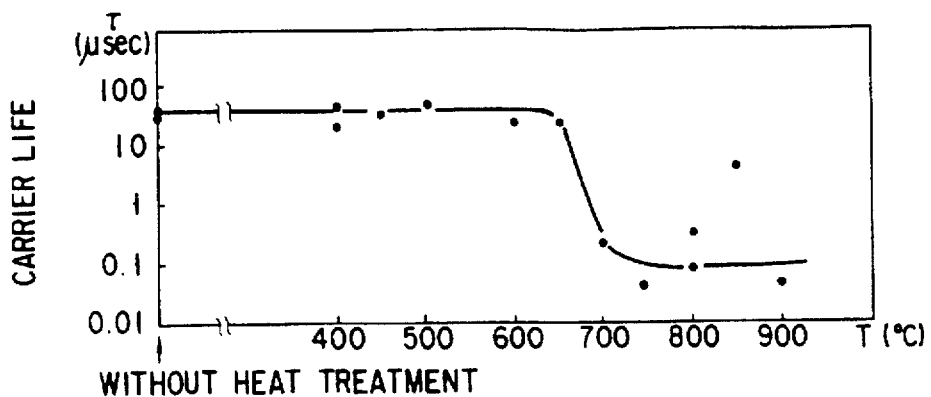
FIG. 41 is a graph showing characteristic change in a recoupling life of minority carriers.

FIG. 41 shows a characteristic change in a re-coupling life of minority carriers present in the Si substrate versus the temperature of heat treatment. As is apparent from FIG. 41, when the heat treatment performed at a temperature of 700° C. or more, Cu is dispersed in Si, resulting in a short life of carriers.

Figure 42:
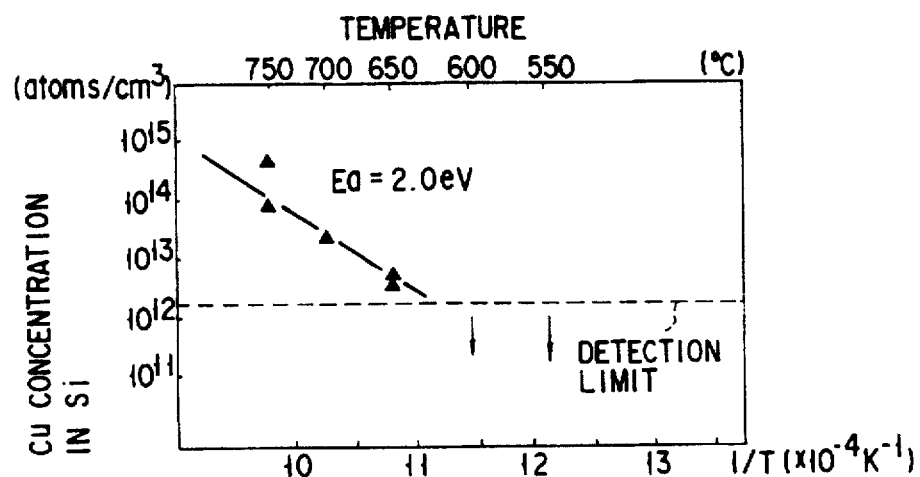
FIG. 42 is a graph showing Arrhenius plots with respect to Cu concentrations in silicon.

FIG. 42 is a graph showing Arrhenius plots of Cu concentrations in Si measured by the atomic absorption method. From this graph, it is obtained that an activation energy for diffusing Cu passing through TiN is 2.0 eV. It is generally said that the concentration of Cu in Si exceeding $10^{11}$ to $10^{12}$ atoms/cm$^3$ has an influence upon device characteristics. From these data, it is found that the reduction temperature should be 600° C. or less.

As mentioned above, taking the grooving and agglomeration phenomena, and a diffusion phenomenon of Cu atoms in an underneath layer, into consideration, the upper limit of the reduction temperature can be determined as 500° C.

Hardness of the metal oxide film

Polishing is very effective means in processing of a metal such as Cu or Ag which does not form a halide compound having high vapor pressure at normal temperatures. Generally to say, it is very difficult to polish a metal having low hardness and high ductility, so that a metal such as Cu or Ag is difficult to be polished due to low hardness thereof. However, it is possible to polish Cu or Ag easier by increasing the hardness thereof through oxidation of the metal.

Figure 43:
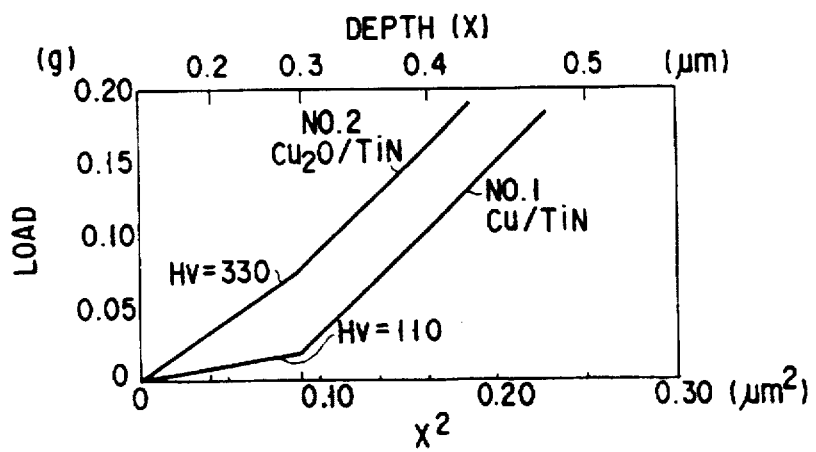
FIG. 43 is a graph showing the relationship between load applying to a film and the depth of indentation.

FIG. 43 is a graph showing the results of hardness of the following two-types of laminated films measured by an indentation hardness tester. One is laminated film formed by stacking a Cu film of 0.3 μm in thickness on a silicon substrate via a TiN film of 1.0 μm in thickness (No. 1). The other is a laminated film formed by stacking a $Cu_2O$ film of 0.3 μm in thickness on a silicon substrate via a TiN film of 1.0 μm in thickness (No. 2). The relationship between the depth of indentation and load indicated when an indentator is indented, can be expressed by the following equation:

$$W(x)=\alpha Hx^2/2$$

wherein x is an indentation depth; W(x) is load to give an indentation depth of x; H is a Vickers hardness; and α is a constant varying depending upon an indentator shape.

From FIG. 43, it is found that the Vickers hardness of Cu is approximately 110 and that of $Cu_2O$ is approximately 330.

Table 4 shows the results obtained when surface roughness (scar) of the Cu film and the $Cu_2O$ film is measured by an unevenness measuring meter after these films are polished with colloidal silica having an average particle diameter of 0.02 μm for 5 minutes.

TABLE 4

|  | Average | Maximum | Minimum |
|---|---|---|---|
| Cu | 1.62 | 5.30 | 0.20 |
| $Cu_2O$ | 0.05 | 0.18 | 0.01 |

As is apparent from Table 4, a number of scars are generated in a surface of the Cu film. Since hardness of Cu is low, mechanical polishing cannot be applied to the Cu film. When the mechanical polishing was applied to the Cu film, film was peeled off by a polishing pad (A film peeling off phenomenon occurred). In contrast, the mechanical polishing can be easily applied to the Cu oxide film, since the hardness thereof is high. In this case, no scars were generated. Since the Cu oxide film is free from stress, the film peeling-off phenomenon was not observed. In addition, the Cu oxide film was polished at a rate as high as approximately 2 μm/min. As a result, desired processing was successfully applied to the Cu oxide film.

In present invention, a gaseous atmosphere means an atmosphere containing an $H_2$ gas or a CO gas, and an atmosphere containing an H ion, a CO ion, an H radical, or a CO radical.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

an insulating film formed on a substrate and having a groove;

a first film formed on a side surface and a bottom surface in said groove;

a wiring layer formed on said first film; and a second film formed on an upper surface of said wiring layer, wherein θ satisfies a condition 0<θ<90°, wherein θ represents an angle between said side surface of said first film and a tangent line of said upper surface at a contact point between said upper surface of said wiring layer and said side surface of said first film.

2. The device according to claim 1, wherein θ and θ' satisfy the condition θ<θ', wherein θ' represents an angle between said upper surface and a tangent line at the vertex of said upper surface.

3. The device according to claim 1, wherein an edge portion of said upper surface close to said contact point in section includes a curvature portion.

4. The device according to claim 1, wherein said first film is made of a material selected from the group consisting of Ti, Nb, W, Mo, Cr, V, Ta, Zr, Hf, and nitrides thereof.

5. The device according to claim 1, wherein said second film is made of a material selected from the group consisting of Ti, Nb, W, Mo, Cr, V, Ta, Zr, Hf, and nitrides thereof.

6. The device according to claim 1, wherein said wiring layer is made of Cu and Ag.

7. A semiconductor device comprising:

insulating film formed on a substrate and having a groove;

a first film, containing a metal, formed on a side surface and a bottom surface in said groove;

an oxide film made of an oxide of said metal formed at crystal boundary of said metal;

a wiring layer formed on said first film.

8. The device according to claim 7, wherein an edge portion of said upper surface close to a contact point between said upper surface of said wiring layer and said side surface of said first film in section includes a curvature portion.

9. The device according to claim 7, wherein said first film is made of a material selected from the group consisting of Ti, Nb, W, Mo, Cr, V, Ta, Zr, Hf, and nitrides thereof.

10. The device according to claim 7, wherein said wiring layer is made of Cu and Ag.

11. The device according to claim 7, further comprising a second film formed on an upper surface of said wiring layer.

12. The device according to claim 11, wherein said second film is made of a material selected from the group consisting of Ti, Nb, W, Mo, Cr, V, Ta, Zr, Hf, and nitrides thereof.

13. The device according to claim 7, wherein θ satisfies a condition 0<θ<90°, wherein θ represents an angle between said side surface of said first film and a tangent line of said upper surface at a contact point between said upper surface of said wiring layer and said side surface of said first film.

14. A device according to claim 7, wherein θ and θ' satisfy a condition θ<θ', wherein θ' represents an angle between said upper surface and a tangent line at the vertex of said upper surface.

* * * * *